United States Patent
Cho et al.

(10) Patent No.: US 12,402,301 B2
(45) Date of Patent: Aug. 26, 2025

(54) SEMICONDUCTOR MEMORY DEVICE HAVING SHIELD LAYER BETWEEN PERIPHERAL CIRCUIT AND CELL ARRAY STRUCTURES

(71) Applicant: Samsung Electronics Co., Ltd., Suwon-si (KR)

(72) Inventors: Min Hee Cho, Suwon-si (KR); Min Tae Ryu, Suwon-si (KR); Huije Ryu, Suwon-si (KR); Sungwon Yoo, Suwon-si (KR); Yongjin Lee, Suwon-si (KR); Wonsok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 17/981,719

(22) Filed: Nov. 7, 2022

(65) Prior Publication Data

US 2023/0337413 A1 Oct. 19, 2023

(30) Foreign Application Priority Data

Apr. 19, 2022 (KR) .................. 10-2022-0048511

(51) Int. Cl.
*H10B 12/00* (2023.01)
*G11C 5/06* (2006.01)

(52) U.S. Cl.
CPC .......... *H10B 12/315* (2023.02); *G11C 5/063* (2013.01); *H10B 12/05* (2023.02); *H10B 12/482* (2023.02); *H10B 12/485* (2023.02); *H10B 12/488* (2023.02); *H10B 12/50* (2023.02)

(58) Field of Classification Search
CPC .... H10B 12/05; H10B 12/315; H10B 12/482; H10B 12/485; H10B 12/488; H10B 12/50; G11C 5/025; G11C 5/063; G11C 8/14; G11C 11/4097
USPC ........................................................ 257/908
See application file for complete search history.

(56) References Cited

U.S. PATENT DOCUMENTS

| | | |
|---|---|---|
| 9,082,783 B2 | 7/2015 | Yamawaki et al. |
| 9,093,460 B2 | 7/2015 | Kim et al. |
| 9,318,374 B2 | 4/2016 | Atsumi et al. |
| 10,825,771 B2 | 11/2020 | Toda et al. |

(Continued)

FOREIGN PATENT DOCUMENTS

| | | |
|---|---|---|
| JP | 2015154028 A | 8/2015 |
| TW | 202209314 A | 3/2022 |

*Primary Examiner* — Hoai V Pham
(74) *Attorney, Agent, or Firm* — Muir Patent Law, PLLC

(57) ABSTRACT

Disclosed are semiconductor memory devices and their fabrication methods. The semiconductor memory device comprises a peripheral circuit structure including peripheral circuits on a semiconductor substrate and a first dielectric layer on the peripheral circuits, a cell array structure on the semiconductor substrate, and a shield layer between the peripheral circuit structure and the cell array structure. The cell array structure includes bit lines, first and second active patterns on the bit lines, first word lines that extend in a second direction on the first active patterns, second word lines that extend in the second direction on the second active patterns, data storage patterns on the first and second active patterns, and a second dielectric layer on the semiconductor substrate. A hydrogen concentration of the first dielectric layer is greater than that of the second dielectric layer.

17 Claims, 14 Drawing Sheets

(56) References Cited

U.S. PATENT DOCUMENTS

| | | |
|---|---|---|
| 11,410,951 B2 | 8/2022 | Choi et al. |
| 2020/0161307 A1 | 5/2020 | Jang et al. |
| 2020/0335405 A1 | 10/2020 | Torek |
| 2021/0202690 A1 | 7/2021 | Thareja et al. |
| 2021/0375877 A1 | 12/2021 | Kim et al. |
| 2021/0399139 A1 | 12/2021 | Li et al. |
| 2022/0246180 A1 | 8/2022 | Lee et al. |
| 2023/0397410 A1* | 12/2023 | Jain .................... G11C 11/4091 |

* cited by examiner

SEMICONDUCTOR MEMORY DEVICE HAVING SHIELD LAYER BETWEEN PERIPHERAL CIRCUIT AND CELL ARRAY STRUCTURES

CROSS-REFERENCE TO RELATED APPLICATION

This U.S. nonprovisional application claims priority under 35 U.S.C. § 119 to Korean Patent Application No. 10-2022-0048511, filed on Apr. 19, 2022, in the Korean Intellectual Property Office, the disclosure of which is hereby incorporated by reference in its entirety.

BACKGROUND

The present inventive concepts relate to a semiconductor memory device, and more particularly, to a semiconductor memory device including vertical channel transistors and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performance while overcoming issues associated with high integration of the semiconductor devices. Accordingly, transistors with vertical channels have been suggested to increase their integration, resistance, current drive capability, etc.

SUMMARY

Some embodiments of the present inventive concepts provide a semiconductor memory device having increased structural stability and a method of fabricating the same.

Some embodiments of the present inventive concepts provide a semiconductor memory device having improved operating reliability and a method of fabricating the same.

Some embodiments of the present inventive concepts provide a method of fabricating a semiconductor memory device which method has less occurrences of defects and a semiconductor memory device fabricated by the same.

According to some embodiments of the present inventive concepts, a semiconductor memory device may comprise: a peripheral circuit structure including peripheral circuits on a semiconductor substrate and a first dielectric layer that covers the peripheral circuits; a cell array structure on the semiconductor substrate; and a shield layer between the peripheral circuit structure and the cell array structure. The cell array structure may include: bit lines that extend lengthwise in a first direction on the semiconductor substrate; first and second active patterns that are alternately disposed along the first direction on each of the bit lines, each of the first and second active patterns including a horizontal part and a vertical part, the first and second active patterns that are adjacent to each other being disposed symmetrically to each other; first word lines that extend lengthwise in a second direction, cross the bit lines, and are disposed on the horizontal parts of the first active patterns; second word lines that extend lengthwise in the second direction, cross the bit lines, and are disposed on the horizontal parts of the second active patterns; data storage patterns on the first and second active patterns; and a second dielectric layer on the semiconductor substrate, the second dielectric layer covering the bit lines, the first and second active patterns, the first and second word lines, and the data storage patterns. A hydrogen concentration of the first dielectric layer may be greater than a hydrogen concentration of the second dielectric layer.

According to some embodiments of the present inventive concepts, a semiconductor memory device may comprise: a first circuit structure and a second circuit structure that are spaced apart from each other on a semiconductor substrate; a shield layer that separates the first and second circuit structures from each other; and a connection contact that penetrates the shield layer and connects the first and second circuit structures to each other. The first circuit structure may include a first transistor and a first dielectric layer that covers the first transistor. The second circuit structure may include a second transistor and a second dielectric layer that covers the second transistor. The second transistor may include: a bit line that extends lengthwise in a first direction on the semiconductor substrate; first and second active patterns that are disposed along the first direction on the bit line; first word lines that extend lengthwise in a second direction, cross the bit line, and are disposed on the first active patterns; and second word lines that extend lengthwise in the second direction, cross the bit line, and are disposed on the second active patterns. A hydrogen diffusivity of the shield layer may be less than a hydrogen diffusivity of the first dielectric layer and a hydrogen diffusivity of the second dielectric layer.

According to some embodiments of the present inventive concepts, a method of fabricating a semiconductor memory device may comprise: forming a first transistor on a semiconductor substrate; forming on the semiconductor substrate a first dielectric layer that covers the first transistor; forming a shield layer that covers the first dielectric layer; forming a second dielectric layer on the shield layer; forming on the second dielectric layer a bit line that extends horizontally; forming a second transistor on the bit line; and forming on the second dielectric layer a third dielectric layer that covers the bit line and the second transistor. The second transistor may include: first and second active patterns on the bit line; first word lines that extend lengthwise, cross the bit line, and are disposed on the first active patterns; and second word lines that extend lengthwise, cross the bit line, and are disposed on the second active patterns. A hydrogen concentration of the first dielectric layer may be greater than a hydrogen concentration of the second dielectric layer.

DETAILED DESCRIPTION OF EMBODIMENTS

It will be herein described a semiconductor memory device according to the present inventive concepts with reference to accompanying drawings. Like numerals refer to like elements throughout. As used herein, the term "contact" refers to a direct connection (i.e., touching) unless the context indicates otherwise.

Figure 1:
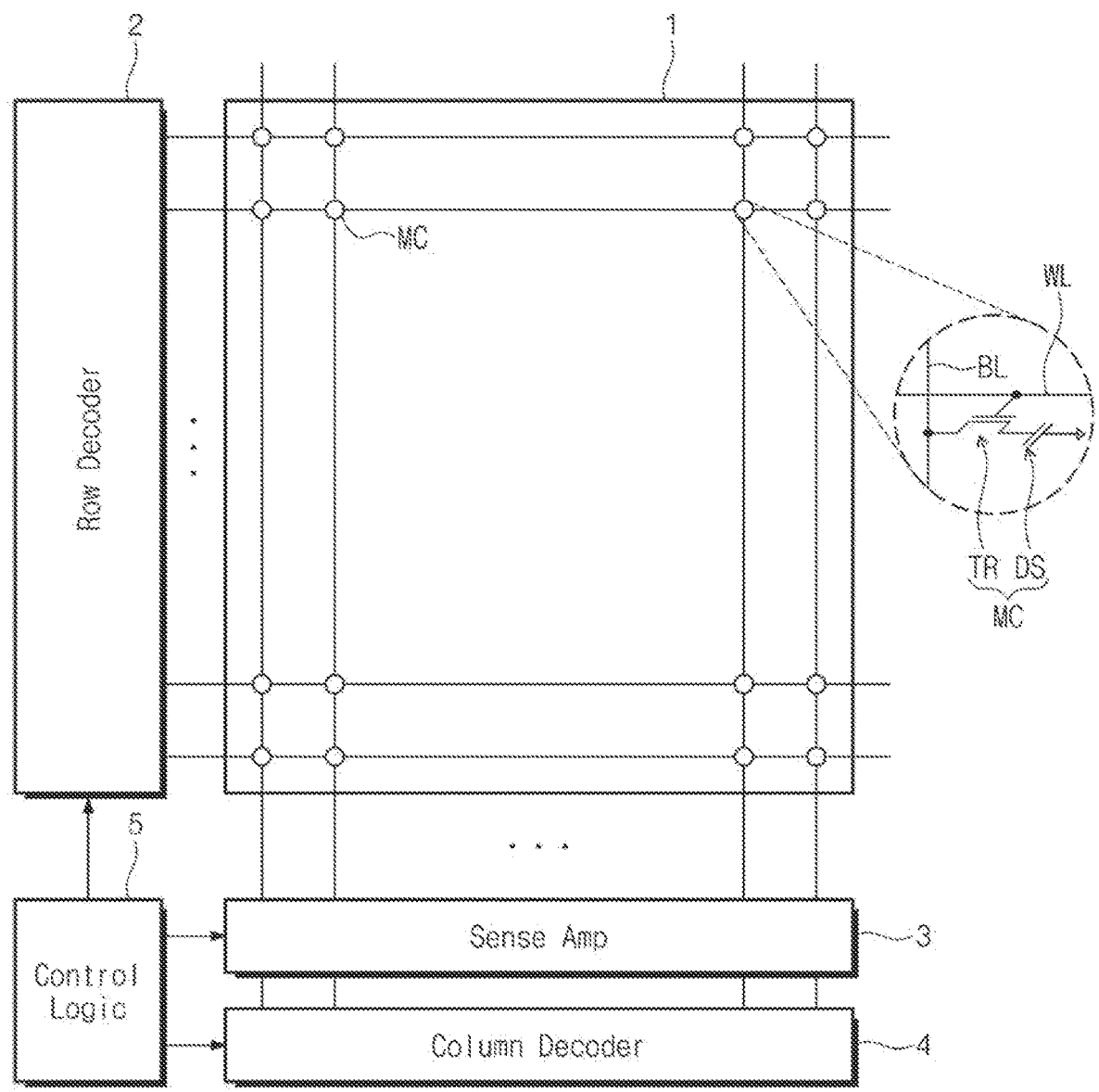
FIG. 1 illustrates a block diagram showing a semiconductor apparatus including a semiconductor memory device, according to some example embodiments of the present inventive concepts.

FIG. 1 illustrates a block diagram showing a semiconductor apparatus including a semiconductor memory device according to some example embodiments of the present inventive concepts.

Referring to FIG. 1, a semiconductor apparatus may include a memory cell array 1, a row decoder 2, a sense amplifier 3, a column decoder 4, and a control logic 5.

The memory cell array 1 may include a plurality of memory cells MC that are arranged two-dimensionally or three-dimensionally. Each of the memory cells MC may be connected between a word line WL and a bit line BL that cross each other.

Each of the memory cells MC may include a selection element TR and a data storage element DS. The selection and data storage elements TR and DS are electrically connected in series to each other. The selection element TR may be connected between the data storage element DS and the word line WL, and the data storage element DS may be connected through the selection element TR to the bit line BL. The selection element TR may be a field effect transistor (FET), and the data storage element DS may be a capacitor, a magnetic tunnel junction pattern, or a variable resistor. For example, the selection element TR may include a transistor, a gate electrode which may be connected to the word line WL, and source/drain terminals which may be connected to the bit line BL and the data storage element DS.

The row decoder 2 may decode an address that is externally input, and may select one of the word lines WL of the memory cell array 1. The address that is decoded in the row decoder 2 may be provided to a row driver (not shown), and in response to a control operation of control circuits, the row driver may provide a certain voltage to a selected word line WL and each of non-selected word lines WL.

In response to an address that is decoded from the column decoder 4, the sense amplifier 3 may detect and amplify a voltage difference between a selected bit line BL and a reference bit line, and may then output the amplified voltage difference.

The column decoder 4 may provide a data delivery pathway between the sense amplifier 3 and an external device (e.g., a memory controller). The column decoder 4 may decode an address that is externally input and may select one of the bit lines BL.

The control logic 5 may generate control signals that control operations to write data to the memory cell array 1 and/or to read data from the memory cell array 1.

Figure 2:
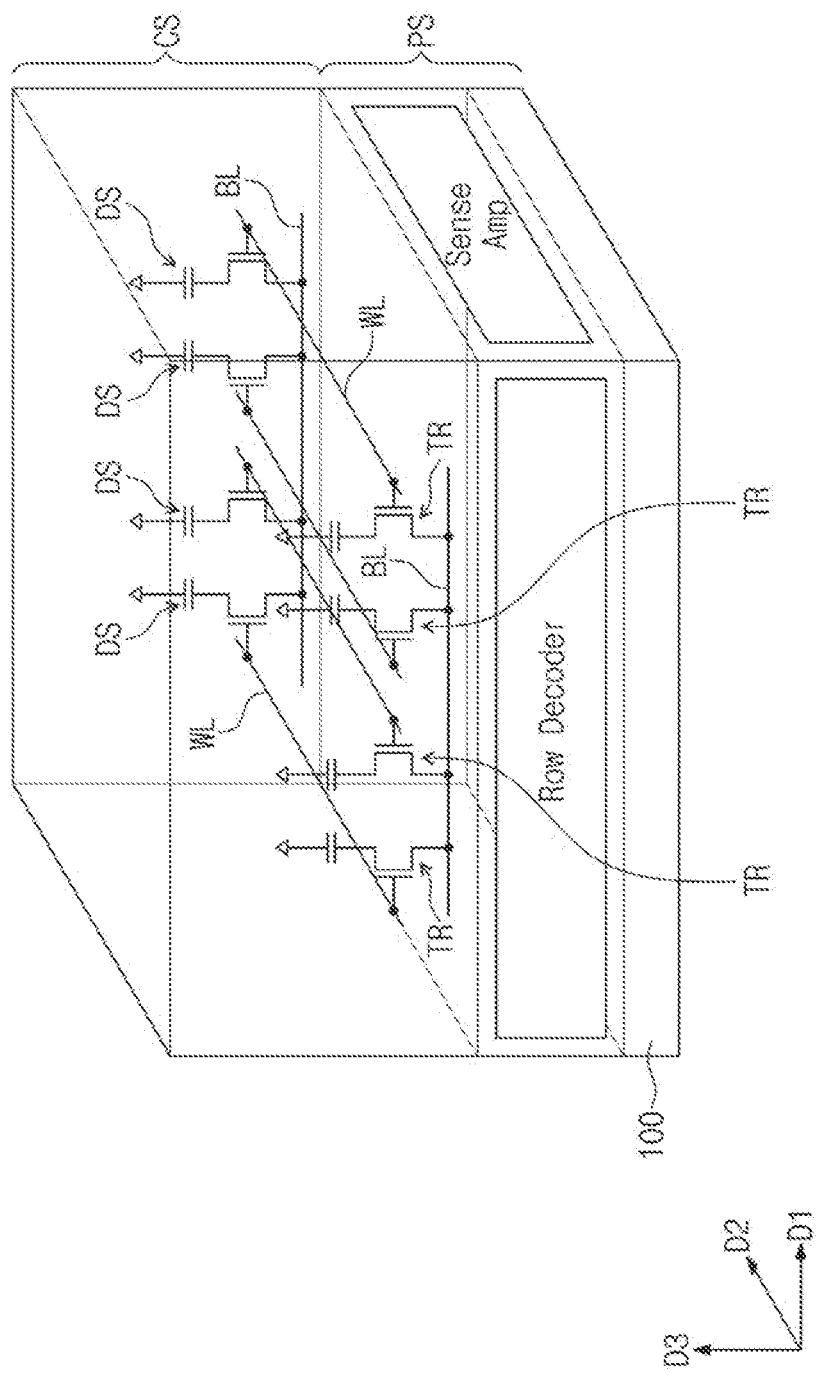
FIG. 2 illustrates a simplified perspective view showing a semiconductor memory device, according to some example embodiments of the present inventive concepts.

FIG. 2 illustrates a simplified perspective view showing a semiconductor memory device according to some example embodiments of the present inventive concepts.

Referring to FIG. 2, a semiconductor memory device may include a peripheral circuit structure PS and a cell array structure CS connected to the peripheral circuit structure PS.

The peripheral circuit structure PS may include core/peripheral circuits that are formed on a semiconductor substrate 100. The core/peripheral circuits may include the row and column decoders (see row decoders 2 and column decoders 4 of FIG. 1), the sense amplifier (see sense amplifier 3 of FIG. 1), and the control logic (see control logic 5 of FIG. 1) discussed with reference to FIG. 1.

The cell array structure CS may include a memory cell array (see memory cell array 1 of FIG. 1) including memory cells (see memory cells MC of FIG. 1) that are arranged two-dimensionally and three-dimensionally on a plane that extends in first and second directions D1 and D2 that cross each other. Each of the memory cells (see memory cells MC of FIG. 1) may include, as discussed above, the selection element TR and the data storage element DS.

According to some embodiments, a vertical channel transistor (VCT) may be included as the selection transistor TR of each memory cell (see memory cells MC of FIG. 1). The vertical channel transistor may indicate a structure in which a channel extends in a direction (or a third direction D3) perpendicular to a top surface of the semiconductor substrate 100. In addition, a capacitor may be provided as the data storage element DS of each memory cell (see memory cells MC of FIG. 1).

According to the embodiment shown in FIG. 2, the peripheral circuit structure PS may be provided on the semiconductor substrate 100, and the cell array structure CS may be provided on the peripheral circuit structure PS.

Differently from that shown in FIG. 2, the peripheral circuit structure PS and the cell array structure CS may be provided on the semiconductor substrate 100, while being horizontally spaced apart from each other.

The peripheral circuit structure PS and the cell array structure CS may be electrically connected to each other. For example, the core/peripheral circuits (see row decoder 2, sense amplifier 3, column decoder 4, and control logic 5 of FIG. 1) of the peripheral circuit structure PS may be electrically connected to the memory cell array (see memory cell array 1 of FIG. 1) of the cell array structure CS.

Figure 3:
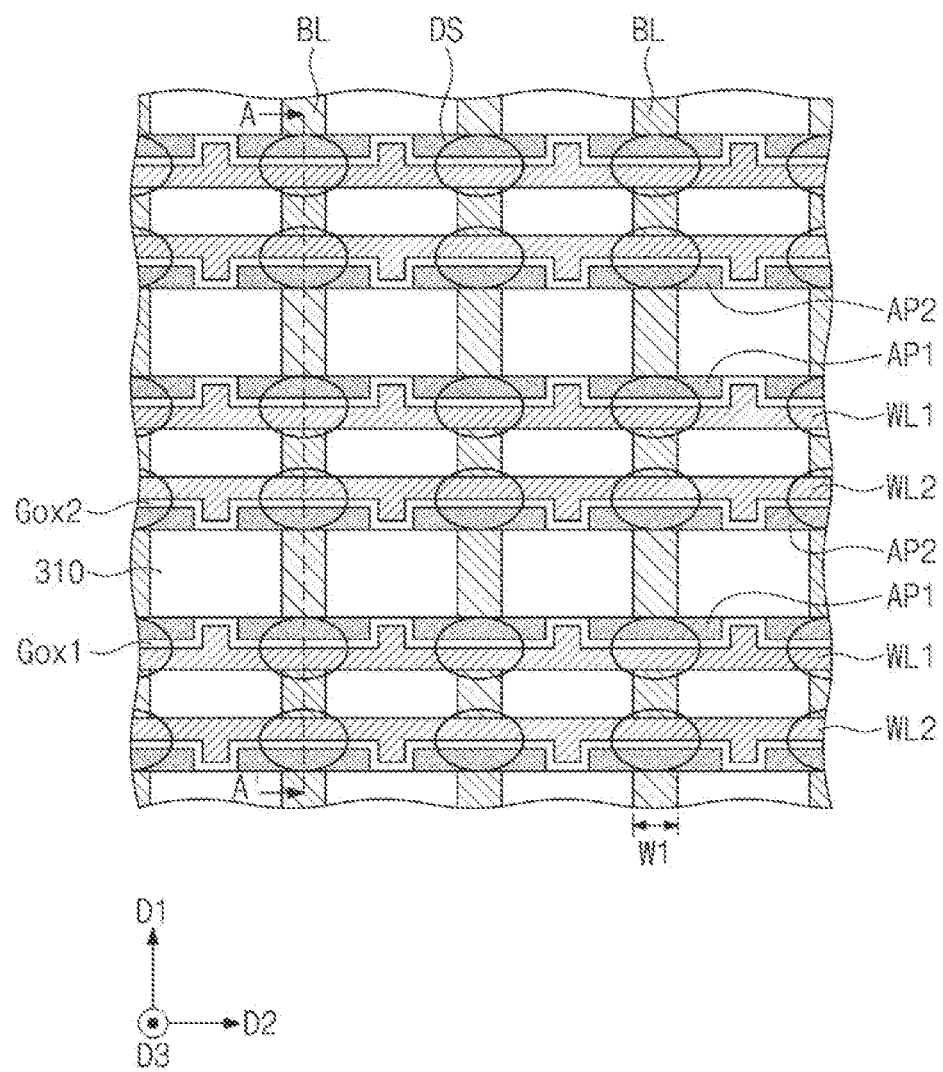
FIG. 3 illustrates a plan view showing a semiconductor memory device, according to some example embodiments of the present inventive concepts.
Figure 4:
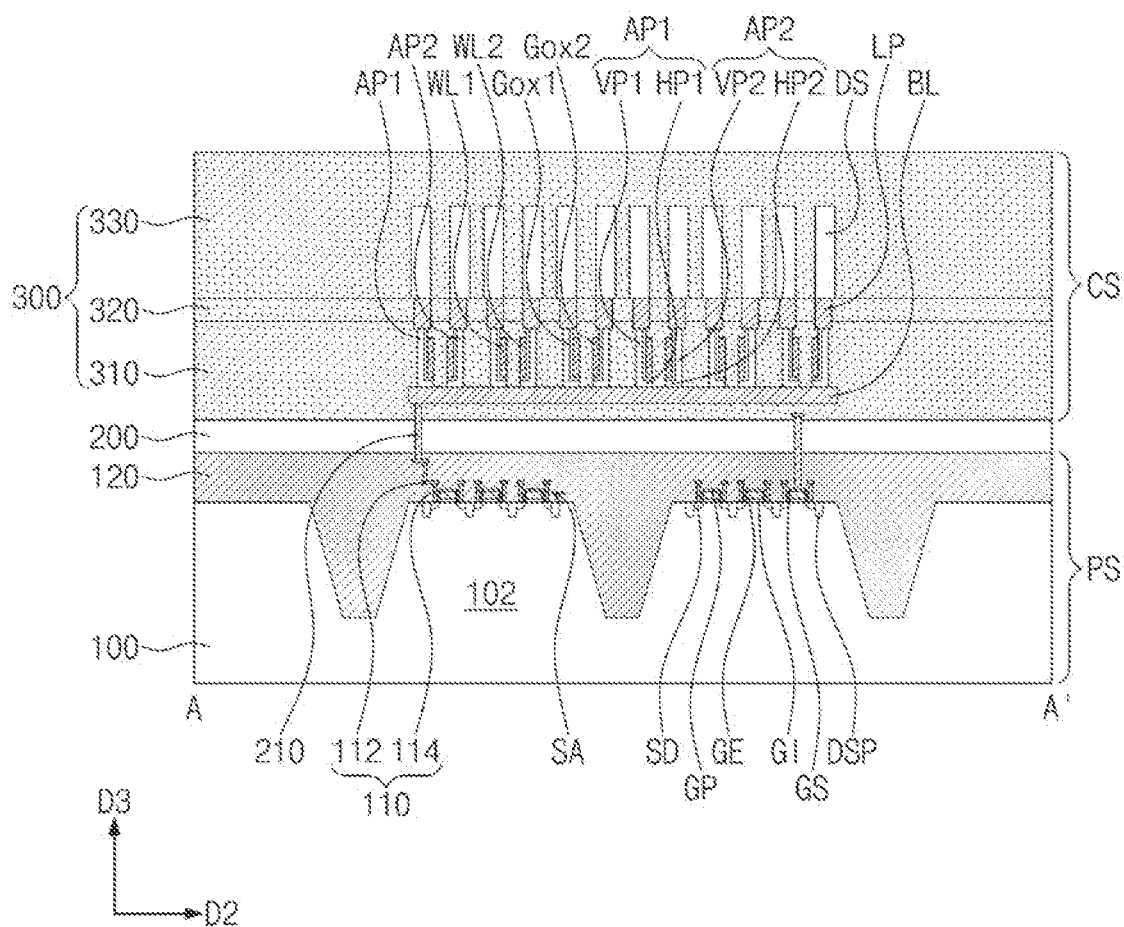
FIGS. 4 to 11 illustrate cross-sectional views showing a semiconductor memory device, according to some example embodiments of the present inventive concepts.

FIG. 3 illustrates a plan view showing a semiconductor memory device according to some example embodiments of the present inventive concepts. FIG. 4 illustrates a cross-sectional view taken along line A-A of FIG. 3, showing a semiconductor memory device according to some example embodiments of the present inventive concepts.

Referring to FIGS. 3 and 4, a semiconductor memory device may include a peripheral circuit structure PS on a semiconductor substrate 100, and may also include a cell array structure CS on the peripheral circuit structure PS.

The semiconductor substrate 100 may include a semiconductor material. The semiconductor substrate 100 may be, for example, a silicon (Si) substrate, a germanium (Ge) substrate, or a silicon-germanium (SiGe) substrate.

A first direction D1 and a second direction D2 may be parallel to a top surface of the semiconductor substrate 100. A third direction D3 may be perpendicular to the top surface of the semiconductor substrate 100 and may intersect all of the first and second directions D1 and D2.

The peripheral circuit structure PS may be disposed on the semiconductor substrate 100. The peripheral circuit structure PS may include core/peripheral circuits SA, formed on active patterns 102, a lower dielectric layer 120 that covers the core/peripheral circuits SA, and a peripheral circuit wiring pattern 110 disposed in the lower dielectric layer 120.

The active patterns 102 may be provided on the semiconductor substrate 100. The active patterns 102 may have their shapes that protrude onto the top surface of the semiconductor substrate 100. When viewed in a plan view, the active patterns 102 may define an area where the core/peripheral circuits SA are provided. The active patterns 102 and the semiconductor substrate 100 may be provided as a unitary single body. For example, the active patterns 102 may be portions of the semiconductor substrate 100 that protrude in the third direction D3 from the semiconductor substrate 100.

The core/peripheral circuits SA may be provided on the active patterns 102. The core/peripheral circuits SA may include the row and column decoders (see row decoders 2 and column decoders 4 of FIG. 1), the sense amplifier (see sense amplifier 3 of FIG. 1), and the control logic (see control logic 5 of FIG. 1) discussed with reference to FIG. 1. For example, the core/peripheral circuits SA may include NMOS and PMOS transistors integrated on the active patterns 102. For more detail, one or more gate electrodes GE may be provided on the active patterns 102. Each of the gate electrodes GE may be provided with source/drain patterns SD on opposite sides thereof. The source/drain patterns SD may be formed by implanting dopants into upper portions of the active patterns 102. Gate dielectric layers GI may be provided between the gate electrodes GE and the active patterns 102. Gate capping patterns GP may be disposed on the gate electrodes GE. Gate spacers GS may be provided on opposite sides of each of the gate electrodes GE.

One of the NMOS and PMOS transistors may be constituted by a single gate electrode GE, a pair of source/drain patterns SD adjacent to the single gate electrode GE, a single gate dielectric layer GI, a single gate capping pattern GP, and a pair of gate spacers GS. The transistors may be divided from each other through device separation patterns DSP disposed between the transistors or between the source/drain patterns SD of the transistors. The device separation patterns DSP may be provided on upper portions of the active patterns 102 between the source/drain patterns SD. FIG. 4 depicts a planar transistor, but the present inventive concepts are not limited thereto. According to some embodiments, the core/peripheral circuits SA may include variously shaped transistors and passive elements.

The peripheral circuit wiring pattern 110 may be disposed on the semiconductor substrate 100. The peripheral circuit wiring pattern 110 may be disposed on the core/peripheral circuits SA. The peripheral circuit wiring pattern 110 may be connected to the core/peripheral circuits SA. The peripheral circuit wiring pattern 110 may include peripheral circuit wiring lines 112 and peripheral circuit contact plugs 114. The peripheral circuit wiring lines 112 may correspond to a wiring pattern for horizontal interconnection of the peripheral circuit wiring pattern 110, and the peripheral circuit contact plugs 114 may correspond to a wiring pattern for vertical interconnection of the peripheral circuit wiring pattern 110. The peripheral circuit wiring lines 112 may be electrically connected through the peripheral circuit contact plugs 114 to the core/peripheral circuits SA. For example, the peripheral circuit wiring lines 112 and the peripheral circuit contact plugs 114 may be coupled to NMOS and PMOS transistors of the core/peripheral circuits SA. For more detail, the peripheral circuit contact plugs 114 may be coupled to the source/drain patterns SD or the gate electrodes GE of the transistors, and the peripheral circuit wiring lines 112 may be connected to the peripheral circuit contact plugs 114.

The lower dielectric layer 120 may be provided on the semiconductor substrate 100. The lower dielectric layer 120 may cover the core/peripheral circuits SA and the peripheral circuit wiring pattern 110. Although not shown, the lower buried dielectric layer 120 may include a plurality of stacked dielectric layers. For example, the lower dielectric layer 120 may include one or more of a silicon oxide ($SiO_2$) layer, a silicon nitride (SiN) layer, a silicon oxynitride (SiON) layer, and a low-k dielectric layer. The lower dielectric layer 120 may contain hydrogen (H). The hydrogen atoms in the lower dielectric layer 120 may prevent interface defects from occurring in transistors of the core/peripheral circuits SA formed based on silicon (Si).

A shield layer 200 may be provided on the peripheral circuit structure PS. The shield layer 200 may cover the lower dielectric layer 120. In example embodiments, a bottom surface of the shield layer 200 may contact a top surface of the lower dielectric layer 120. The shield layer 200 may completely cover the core/peripheral circuits SA. For example, the entirety of the core/peripheral circuits SA may be positioned below the shield layer 200. The shield layer 200 may have a plate shape. The shield layer 200 may include a material whose hydrogen diffusivity is less than that of a material included in the lower dielectric layer 120 and that of a material included in an upper dielectric layer 300 which will be discussed below. For example, the shield layer 200 may include aluminum oxide ($Al_2O_3$) or metal nitride. The metal nitride may include titanium nitride (TiN) or tantalum nitride (TaN). A hydrogen concentration of the shield layer 200 may be less than that of the lower dielectric layer 120. The shield layer 200 may prevent hydrogen atoms from diffusing from the lower dielectric layer 120 into the cell array structure CS. When the lower dielectric layer 120 includes silicon oxide ($SiO_2$), the shield layer 200 may include silicon nitride ($Si_3N_4$) whose hydrogen diffusivity is less than that of silicon oxide ($SiO_2$).

The cell array structure CS may be provided on the shield layer 200. The following will describe a detailed configuration of the cell array structure CS.

On the shield layer 200, the bit lines BL may extend lengthwise in the first direction D1 and may be spaced apart from each other in the second direction D2. The bit lines BL may each have a first width W1 in the second direction D2, and the first width W1 may range from about 1 nm to about 50 nm.

The bit lines BL may include, for example, doped polysilicon, metal, conductive metal nitride (MN), conductive metal silicide (MSi), conductive metal oxide (MO), or any combination thereof. The bit lines BL may be formed of doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrO), ruthenium oxide (RuO), or any combination thereof, but the present inventive concepts are not limited thereto. The bit lines BL may include a single layer or multiple layers formed of one or more of the materials discussed above. In some embodiments, the bit lines BL may include a two-dimensional or three-dimensional material, for example, graphene as a carbon-based two-dimensional material, carbon nano-tube as a three-dimensional material, or any combination thereof.

A pair of first and second active patterns AP1 and AP2 may be disposed on the bit lines BL. On each bit line BL, the first active patterns AP1 may be disposed spaced apart from each other in the second direction D2, and the second active patterns AP2 may be disposed spaced apart from each other in the second direction D2. The first and second active patterns AP1 and AP2 may be alternately arranged along the first direction D1 on each bit line BL. For example, the first and second active patterns AP1 and AP2 may be two-dimensionally arranged along the first direction D1 and the second direction D2.

Each of the first active patterns AP1 may include a first horizontal part HP1 disposed on the bit line BL and a first vertical part VP1 that vertically protrudes from the first horizontal part HP1. The first horizontal part HP1 and the first vertical part VP1 may be in material continuity with one another. As used herein, the term "material continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures.

Each of the second active patterns AP2 may include a second horizontal part HP2 disposed on the bit line BL and a second vertical part VP2 that vertically protrudes from the second horizontal part HP2. The second horizontal part HP2 and the second vertical part VP2 may be in material continuity with one another. The second active patterns AP2 may be disposed on each bit line BL so as to have mirror symmetry with respect to the first active patterns AP1.

The first and second vertical parts VP1 and VP2 may have their vertical lengths in a direction perpendicular to the top surface of the semiconductor substrate 100, and may have their widths in the first direction D1. The vertical length of each of the first and second vertical parts VP1 and VP2 may be about 2 to 10 times the width of each of the first and second vertical parts VP1 and VP2, but the present inventive concepts are not limited thereto. When viewed in the first direction D1, the width of each of the first and second vertical parts VP1 and VP2 may range from several nanometers to tens of nanometers. For example, the width of each of the first and second vertical parts VP1 and VP2 may range from about 1 nm to about 30 nm, or from 1 nm to about 10 nm.

The first and second horizontal parts HP1 and HP2 may be in direct contact with top surfaces of the bit lines BL. A thickness in the third direction D3 of each of the first and second horizontal parts HP1 and HP2 may be substantially the same as a thickness in the first direction D1 of each of the first and second vertical parts VP1 and VP2.

On each of the first active pattern AP1, the first horizontal part HP1 may include a first source/drain region, a top end of the first vertical part VP1 may include a second source/drain region, and a first channel region may be included between the first and second source/drain regions.

On each of the second active patterns AP2, the second horizontal part HP2 may include a third source/drain region, a top end of the second vertical part VP2 may include a fourth source/drain region, and a second channel region may be included between the third and fourth source/drain regions.

According to some embodiments, the first channel region of the first active pattern AP1 may be controlled by a first word line WL1, and the second channel region of the second active pattern AP2 may be controlled by a second word line WL2.

The first and second active patterns AP1 and AP2 may include a semiconductor material, such as silicon (Si), germanium (Ge), or silicon-germanium (SiGe).

Alternatively, the first and second active patterns AP1 and AP2 may include an oxide semiconductor, such as $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or any combination thereof. For example, the first and second active patterns AP1 and AP2 may include indium-gallium-zinc oxide (IGZO). The first and second active patterns AP1 and AP2 may each have a single layer or multiple layers of the oxide semiconductor. The first and second active patterns AP1 and AP2 may include an amorphous, crystalline, or polycrystalline oxide semiconductor. In some embodiments, the first and second active patterns AP1 and AP2 may each have a bandgap energy greater than that of silicon. For example, the first and second active patterns AP1 and AP2 may each have a bandgap energy of about 1.5 eV to about 5.6 eV. When each of the first and second active patterns AP1 and AP2 has a bandgap energy of about 2.0 eV to about 4.0 eV, the first and second active patterns AP1 and AP2 may each have optimum channel performance.

In some embodiments, the first and second active patterns AP1 and AP2 may include a two-dimensional or three-dimensional material, for example, graphene as a carbon-based two-dimensional material, carbon nano-tube as a three-dimensional material, or any combination thereof.

On the first horizontal parts HP1 of the first active patterns AP1, the first word lines WL1 may extend in the second direction D2, while running across the bit lines BL. On the second horizontal parts HP2 of the second active patterns AP2, the second word lines WL2 may extend in the second direction D2, while running across the bit lines BL.

The first and second word lines WL1 and WL2 may be alternately arranged along the first direction D1. A pair of first and second word lines WL1 and WL2 may be disposed between the first and second vertical parts VP1 and VP2 of a pair of first and second active patterns AP1 and AP2.

Each of the first and second word lines WL1 and WL2 may have first and second sidewalls that are opposite to each other. The first sidewalls of the first and second word lines WL1 and WL2 may be adjacent to the first and second vertical parts VP1 and VP2 of the first and second active patterns AP1 and AP2. The second sidewalls of the first and second word lines WL1 and WL2 may be disposed to face each other.

The second sidewall of the first word line WL1 may be aligned with a sidewall of the first horizontal part HP1 included in the first active pattern AP1. The second sidewall of the second word line WL2 may be aligned with a sidewall of the second horizontal part HP2 included in the second active pattern AP2.

The first and second word lines WL1 and WL2 may have their top surfaces located at a lower level than that of top surfaces of the first and second vertical parts VP1 and VP2 included in the first and second active patterns AP1 and AP2. In addition, the first and second word lines WL1 and WL2 may each have a spacer shape. For example, the first and second word lines WL1 and WL2 may have rounded top surfaces, when viewed in plan view.

The first and second word lines WL1 and WL2 may include, for example, doped poly-silicon, metal, conductive metal nitride (MN), conductive metal silicide (MSi), conductive metal oxide (MO), or any combination thereof. The first and second word lines WL1 and WL2 may be formed of doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrO), ruthenium oxide (RuO), or any combination thereof, but the present inventive concepts are not limited thereto. The first and second word lines WL1 and WL2 may each have a single layer or multiple layers including the material discussed above. In some embodiments, the first and second word lines WL1 and WL2 may include a two-dimensional or three-dimensional material, for example, graphene as a carbon-based two-dimensional material, carbon nano-tube as a three-dimensional material, or any combination thereof.

A first gate dielectric pattern Gox1 may be disposed between the first word line WL1 and the first active patterns AP1 arranged along the second direction D2. The first gate dielectric pattern Gox1 may be interposed between the first sidewall of the first word line WL1 and the first vertical parts VP1 of the first active patterns AP1, and between a bottom surface of the first word line WL1 and the first horizontal parts HP1 of the first active patterns AP1. The first gate dielectric pattern Gox1 may contact the first vertical parts VP1 and the first horizontal parts HP1 of the first active patterns AP1. The first gate dielectric pattern Gox1 may have a substantially uniform thickness. The first gate dielectric pattern Gox1 may be exposed on lateral surfaces of the first horizontal parts HP1 included in the first active patterns AP1, between the first and second active patterns AP1 and AP2 that are adjacent to each other in the second direction D2.

A second gate dielectric pattern Gox2 may be interposed between the second word line WL2 and the second active patterns AP2 arranged along the second direction D2. The second gate dielectric pattern Gox2 may be interposed between the first sidewall of the second word line WL2 and the second vertical parts VP2 of the second active patterns AP2, and between a bottom surface of the second word line WL2 and the second horizontal parts HP2 of the second active patterns AP2. The second gate dielectric pattern Gox2 may contact the second vertical parts VP2 and the second horizontal parts HP2 of the second active patterns AP2. The second gate dielectric pattern Gox2 may have a substantially uniform thickness. The second gate dielectric pattern Gox2 may be exposed on lateral surfaces of the second horizontal parts HP2 included in the second active patterns AP2, between the first and second active patterns AP1 and AP2 that are adjacent to each other in the second direction D2.

The first and second gate dielectric patterns Gox1 and Gox2 may be formed of a silicon oxide (SiO) layer, a silicon nitride (SiN) layer, a high-k dielectric layer whose dielectric constant is greater than that of a silicon oxide layer, or any combination thereof. The high-k dielectric layer may be formed of metal oxide or metal oxynitride. For example, the high-k dielectric layer may be formed of hafnium oxide (HfO), hafnium silicon oxide (HfSiO), hafnium silicon oxynitride (HfSiON), hafnium tantalum oxide (HMO), hafnium titanium oxide (HMO), hafnium zinc oxide (HfZnO), zinc oxide (ZnO), aluminum oxide (AlO), or any combination thereof, but the present inventive concepts are not limited thereto.

A first dielectric pattern 310 may be provided on the shield layer 200. A bottom surface of the first dielectric pattern 310 may contact a top surface of the shield layer 200. The first dielectric pattern 310 may bury the bit lines BL, the first and second active patterns AP1 and AP2, the first and second word lines WL1 and WL2, and the first and second gate dielectric patterns Gox1 and Gox2. For example, the first dielectric pattern 310 may fill a space between the first and second word lines WL1 and WL2 that are adjacent to each other. The first dielectric pattern 310 may fill a space between the first and second horizontal parts HP1 and HP2 of the first and second active patterns AP1 and AP2. The first dielectric pattern 310 may cover the top surfaces of the first and second word lines WL1 and WL2. The first dielectric pattern 310 may have a top surface substantially coplanar with those of the first and second vertical parts VP1 and VP2 included in the first and second active patterns AP1 and AP2. The first dielectric pattern 310 may include one or more of a silicon oxide (SiO) layer, a silicon nitride (SiN) layer, a silicon oxynitride (SiON) layer, and a low-k dielectric layer.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

An interlayer dielectric pattern 320 may be disposed on the first dielectric pattern 310. The interlayer dielectric pattern 320 may cover the top surface of the first dielectric pattern 310 and the top surfaces of the first and second vertical parts VP1 and VP2 included in the first and second active patterns AP1 and AP2. A bottom surface of the interlayer dielectric pattern 320 may contact the top surfaces of the first dielectric pattern 310 and the first and second vertical parts VP1 and VP2. The interlayer dielectric pattern 320 may include the same material as that of the first dielectric pattern 310. For example, the interlayer dielectric pattern 320 may include one or more of a silicon oxide (SiO) layer, a silicon nitride (SiN) layer, a silicon oxynitride (SiON) layer, and a low-k dielectric layer.

The interlayer dielectric pattern 320 may be provided therein with landing pads LP in contact with the first and second vertical parts VP1 and VP2 of the first and second active patterns AP1 and AP2. When viewed in a plan view, the landing pads LP may each have a circular shape, an oval shape, a rectangular shape, a square shape, a rhombic shape, a hexagonal shape, or any suitable shapes. The landing pads LP may be formed of doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrO), ruthenium oxide (RuO), or any combination thereof, but the present inventive concepts are not limited thereto.

According to some embodiments, data storage patterns DS may be disposed on the interlayer dielectric pattern 320. The data storage patterns DS may each correspond to the data storage element DS discussed with reference to FIG. 1. The data storage patterns DS may be disposed on corresponding landing pads LP. For example, each of the data storage patterns DS may contact a corresponding one of the landing pads LP. The data storage patterns DS may be correspondingly electrically connected through the landing pads LP to the first and second vertical parts VP1 and VP2 of the first and second active patterns AP1 and AP2. The data storage patterns DS may be arranged in a matrix shape along the first direction D1 and the second direction D2.

For example, the data storage patterns DS may be capacitors, each of which may include bottom and top electrodes and a capacitor dielectric layer between the bottom and top electrodes. In this case, the bottom electrode of the data storage pattern DS may contact the landing pad LP, and when viewed in a plan view, may have a circular shape, an oval shape, a rectangular shape, a square shape, a rhombic shape, a hexagonal shape, or any other suitable shape.

Alternatively, the data storage patterns DS may each be a variable resistance pattern whose two resistance states are switched due to an electrical pulse applied to a memory element. For example, the data storage patterns DS may include a phase-change material whose crystalline state is changed based on an amount of current, perovskite compounds, transition metal oxide, magnetic materials, ferromagnetic materials, or antiferromagnetic materials.

A second dielectric pattern 330 may be disposed on the interlayer dielectric pattern 320. A bottom surface of the second dielectric pattern 330 may contact a top surface of the interlayer dielectric pattern 320. On the interlayer dielectric pattern 320, the second dielectric pattern 330 may cover the landing pads LP and the data storage patterns DS. The second dielectric pattern 330 may include the same material as that of the first dielectric pattern 310 and that of the interlayer dielectric pattern 320. For example, the second dielectric pattern 330 may include one or more of a silicon oxide (SiO) layer, a silicon nitride (SiN) layer, a silicon oxynitride (SiON) layer, and a low-k dielectric layer.

An upper dielectric layer 300 may be constituted by the first dielectric pattern 310, the interlayer dielectric pattern 320, and the second dielectric pattern 330. For example, the first dielectric pattern 310, the interlayer dielectric pattern 320, and the second dielectric pattern 330 may be formed of the same material. The first dielectric pattern 310, the interlayer dielectric pattern 320, and the second dielectric pattern 330 may constitute a unitary single body. The present inventive concepts, however, are not limited thereto, and the first dielectric pattern 310, the interlayer dielectric pattern 320, and the second dielectric pattern 330 may be formed of different materials or may be provided as separate components having boundaries present therebetween.

The upper dielectric layer 300 may not substantially contain hydrogen atoms therein. For example, a hydrogen concentration of the upper dielectric layer 300 may be less than that of the lower dielectric layer 120. The hydrogen concentration of the upper dielectric layer 300 may be less than that of the shield layer 200. The present inventive concepts, however, are not limited thereto. The hydrogen concentration of the upper dielectric layer 300 may be less than that of the shield layer 200.

According to some embodiments of the present inventive concepts, as the lower dielectric layer 120 of the peripheral circuit structure PS contains a large amount of hydrogen, the lower dielectric layer 120 may prevent interface defects from occurring in transistors of the core/peripheral circuits SA formed based on silicon (Si). As the upper dielectric layer 300 of the cell array structure CS contains no or small amount of hydrogen, the first and second active patterns AP1 and AP2 formed based on IGZO may be prevented from being damaged due to hydrogen atoms. In addition, the shield layer 200 may include a material whose hydrogen diffusivity is low. Therefore, during fabrication or operation of the semiconductor memory device, the shield layer 200 may prevent the first and second active patterns AP1 and AP2 from being damaged due to hydrogen atoms that diffuse from the lower dielectric layer 120 into the cell array structure CS. Accordingly, the semiconductor memory device may improve in structural stability and operating reliability.

Referring still to FIGS. 3 and 4, the peripheral circuit structure PS and the cell array structure CS may be connected though inter-structure connection contacts 210. The inter-structure connection contacts 210 may vertically penetrate the lower dielectric layer 120, the shield layer 200, and the upper dielectric layer 300 to connect the bit lines BL of the cell array structure CS to the peripheral circuit wiring pattern 110 of the peripheral circuit structure PS. For example, the inter-structure connection contacts 210 may be conductive posts (or vertical connection wiring structures such as conductive vias) that vertically connect the bit lines BL to the peripheral circuit wiring pattern 110. Alternatively, the inter-structure connection contacts 210 may be directly connected not to the peripheral circuit wiring pattern 110, but to the core/peripheral circuits SA. The inter-structure connection contacts 210 may include metal, such as copper (Cu), gold (Au), or tungsten (W).

Figure 5:
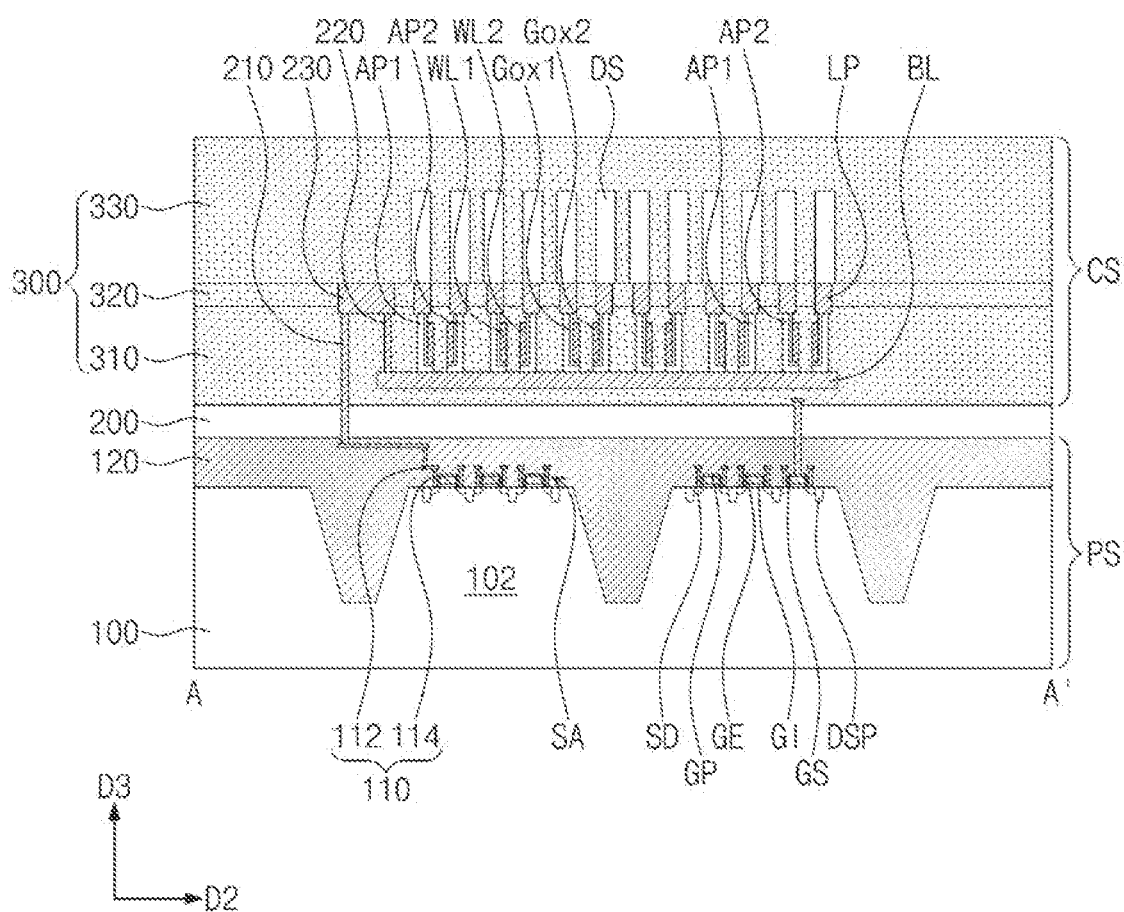

FIG. 5 illustrates a cross-sectional view showing a semiconductor memory device according to some example embodiments of the present inventive concepts. For convenience of description, components the same as those of the embodiments discussed with reference to FIGS. 1 to 4 are allocated the same reference numerals thereto, and a repetitive explanation thereof will be omitted or abridged below. The following description will focus on differences between the embodiments of FIGS. 1 to 4 and other embodiments described below.

Referring to FIG. 5, the inter-structure connection contacts 210 may not be directly connected to the bit lines BL of the cell array structure CS. For example, first extension patterns 220 and second extension patterns 230 may be interposed between the inter-structure connection contacts 210 and the bit lines BL. The second extension patterns 230 may correspond to a wiring pattern for horizontal interconnection between the bit lines BL and the peripheral circuit wiring pattern 110, and the inter-structure connection contacts 210 and the first extension patterns 220 may correspond to a wiring pattern for vertical interconnection between the bit lines BL and the peripheral circuit wiring pattern 110.

The inter-structure connection contacts 210 may be conductive posts (or vertical connection wiring structures such as conductive vias) which are connected to the peripheral circuit wiring pattern 110 and which extend in the third direction D3 from a top surface of the peripheral circuit wiring pattern 110. The inter-structure connection contacts 210 may vertically penetrate the lower dielectric layer 120, the shield layer 200, and the first dielectric pattern 310 of the upper dielectric layer 300. The inter-structure connection contacts 210 may include metal, such as copper (Cu), gold (Au), or tungsten (W). The interlayer dielectric pattern 320 may cover top surfaces of the inter-structure connection contacts 210.

The first extension patterns 220 may be conductive posts (or vertical connection wiring structures such as conductive vias) which are connected to the bit lines BL and which extend in the third direction D3 from the top surfaces of the bit lines BL. The first extension patterns 220 may vertically penetrate the upper dielectric layer 300. The first extension patterns 220 may include metal, such as copper (Cu), gold (Au), or tungsten (W). The interlayer dielectric pattern 320 may cover top surfaces of the first extension patterns 220. The top surfaces of the first extension patterns 220 may be located at substantially the same level as that of the top surfaces of the inter-structure connection contacts 210, that of the top surface of the first dielectric pattern 310, and that of the top surfaces of the first and second vertical parts VP1 and VP2 included in the first and second active patterns AP1 and AP2. The first extension patterns 220 may be horizontally spaced apart from the inter-structure connection contacts 210.

The second extension patterns 230 may be disposed in the interlayer dielectric pattern 320, and may be in contact with the inter-structure connection contacts 210 and the first extension patterns 220. The second extension patterns 230 may be located at the same level as that of the landing pads LP. The second extension patterns 230 may be formed of doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide (IrO), ruthenium oxide (RuO), or any combination thereof, but the present inventive concepts are not limited thereto.

A wiring pattern, a post, a via, or a pad for electrical connection may be formed of a metallic material, and the metallic material may have a high hydrogen diffusivity.

According to some embodiments of the present inventive concepts, an electrical connection length may be increased between the bit lines BL and the peripheral circuit wiring pattern 110. There may be a large diffusion length from the lower dielectric layer 120 having a high hydrogen concentration to the first and second active patterns AP1 and AP2 along the inter-structure connection contacts 210, the first extension patterns 220, and the second extension patterns 230. Therefore, during fabrication or operation of the semiconductor memory device, the inter-structure connection contacts 210, the first extension patterns 220, and the second extension patterns 230 may prevent the first and second active patterns AP1 and AP2 from being damaged due to hydrogen atoms that diffuse from the lower dielectric layer 120 into the cell array structure CS. Accordingly, the semiconductor memory device may improve in structural stability and operating reliability.

Figure 6:
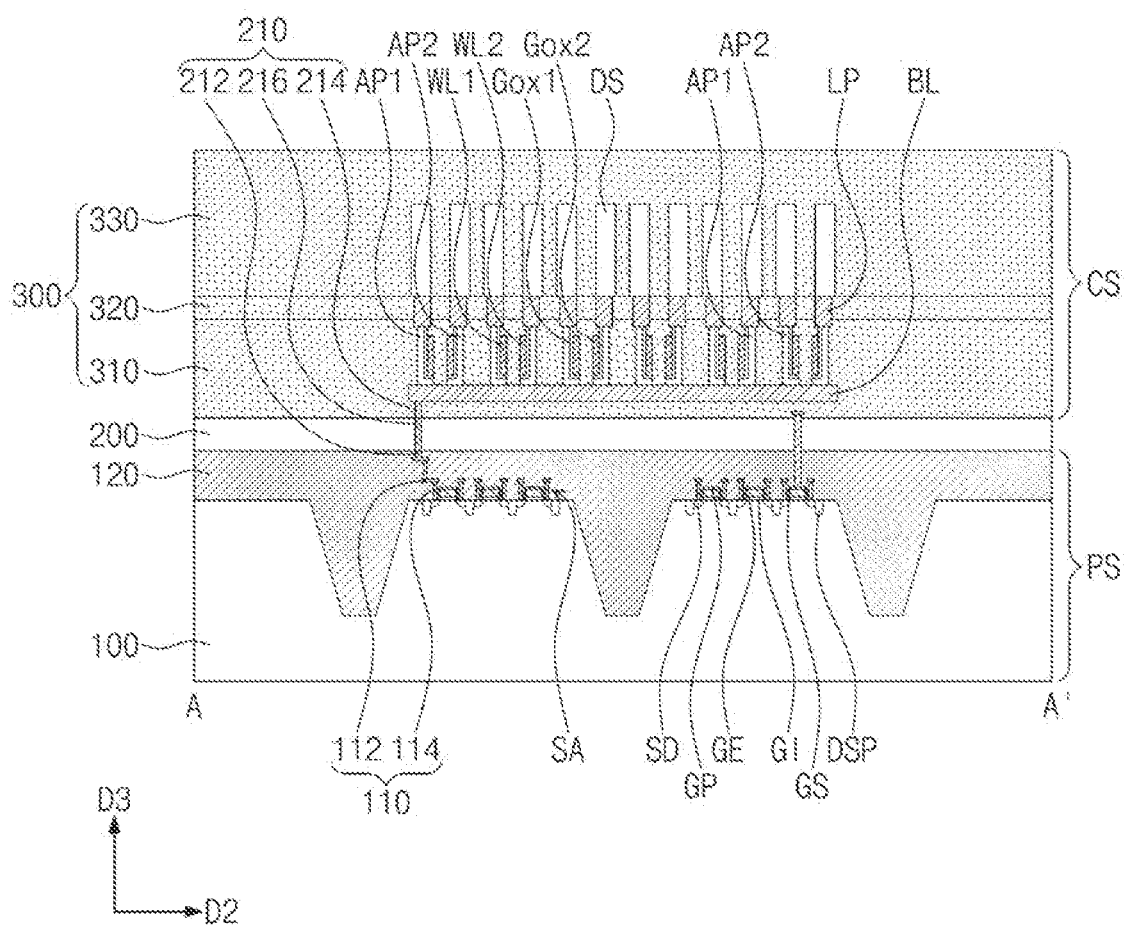

FIG. 6 illustrates a cross-sectional view showing a semiconductor memory device according to some example embodiments of the present inventive concepts.

Referring to FIG. 6, the inter-structure connection contacts 210 may be directly connected to the bit lines BL of the cell array structure CS. For example, the inter-structure connection contacts 210 may be conductive posts (or vertical connection wiring structures such as conductive vias) that extend in the third direction D3 to connect the peripheral circuit wiring pattern 110 to the bit lines BL. The inter-structure connection contacts 210 may vertically penetrate the lower dielectric layer 120, the shield layer 200, and the upper dielectric layer 300.

Each of the inter-structure connection contacts 210 may include a first low-resistance metal part 212, a second low-resistance metal part 214, and a barrier metal part 216.

The first low-resistance metal part 212 may be coupled to the peripheral circuit wiring pattern 110 in the lower dielectric layer 120. For example, the first low-resistance metal part 212 may be a conductive post (or a vertical connection wiring structure such as a conductive via) which is connected to the peripheral circuit wiring pattern 110 and which extends in the third direction D3 from the top surface of the peripheral circuit wiring pattern 110. The first low-resistance metal part 212 may contact the top surface of the peripheral circuit wiring lines 112. The first low-resistance metal part 212 may include metal whose resistance is low, such as copper (Cu), gold (Au), or tungsten (W).

The second low-resistance metal part 214 may be coupled to the bit line BL in the upper dielectric layer 300. For example, the second low-resistance metal part 214 may be a conductive post (or a vertical connection wiring structure such as a conductive via) which is connected to the bit line BL and which extends in a direction opposite to the third direction D3 from a bottom surface of the bit line BL. The second low-resistance metal part 214 may contact the bottom surface of the bit line BL. The second low-resistance metal part 214 may include metal whose resistance is low, such as copper (Cu), gold (Au), or tungsten (W).

The barrier metal part 216 may connect the first low-resistance metal part 212 and the second low-resistance metal part 214 to each other in the shield layer 200. The barrier metal part 216 may be a conductive post (or a vertical connection wiring structure such as a conductive via) that vertically penetrates the shield layer 200. The barrier metal part 216 may include a conductive material whose hydrogen diffusivity is low. For example, the barrier metal part 216 may include a titanium nitride (TiN) layer or a tantalum nitride (TaN) layer. The hydrogen diffusivity of the barrier metal part 216 may be less than that of the lower dielectric layer 120.

FIG. 6 depicts that the first low-resistance metal part 212, the barrier metal part 216, and the second low-resistance metal part 214 are sequentially disposed along the third direction D3 and are provided in the form of a single pillar shape, but the present inventive concepts are not limited thereto. According to some embodiments, the first low-resistance metal part 212 may not be provided. For example, the barrier metal part 216 may extend into the lower dielectric layer 120 to be coupled to the peripheral circuit wiring pattern 110. According to other embodiments, the second low-resistance metal part 214 may not be provided. For example, the barrier metal part 216 may extend into the upper dielectric layer 300 to be coupled to the bit line BL. According to other embodiments, neither the first low-resistance metal part 212 nor the second low-resistance metal part 214 may be provided. For example, the barrier metal part 216 may extend into the lower and upper dielectric layers 120 and 300 to be coupled to the peripheral circuit wiring pattern 110 and the bit line BL.

According to some embodiments of the present inventive concepts, the inter-structure connection contact 210 may include the barrier metal part 216 whose hydrogen diffusivity is low in the vicinity of the shield layer 200. Therefore, during fabrication or operation of the semiconductor memory device, the first and second active patterns AP1 and AP2 may be prevented from being damaged due to hydrogen atoms that diffuse from the lower dielectric layer 120 into the cell array structure CS along the inter-structure connection contacts 210. Accordingly, the semiconductor memory device may improve in structural stability and operating reliability.

Figure 7:
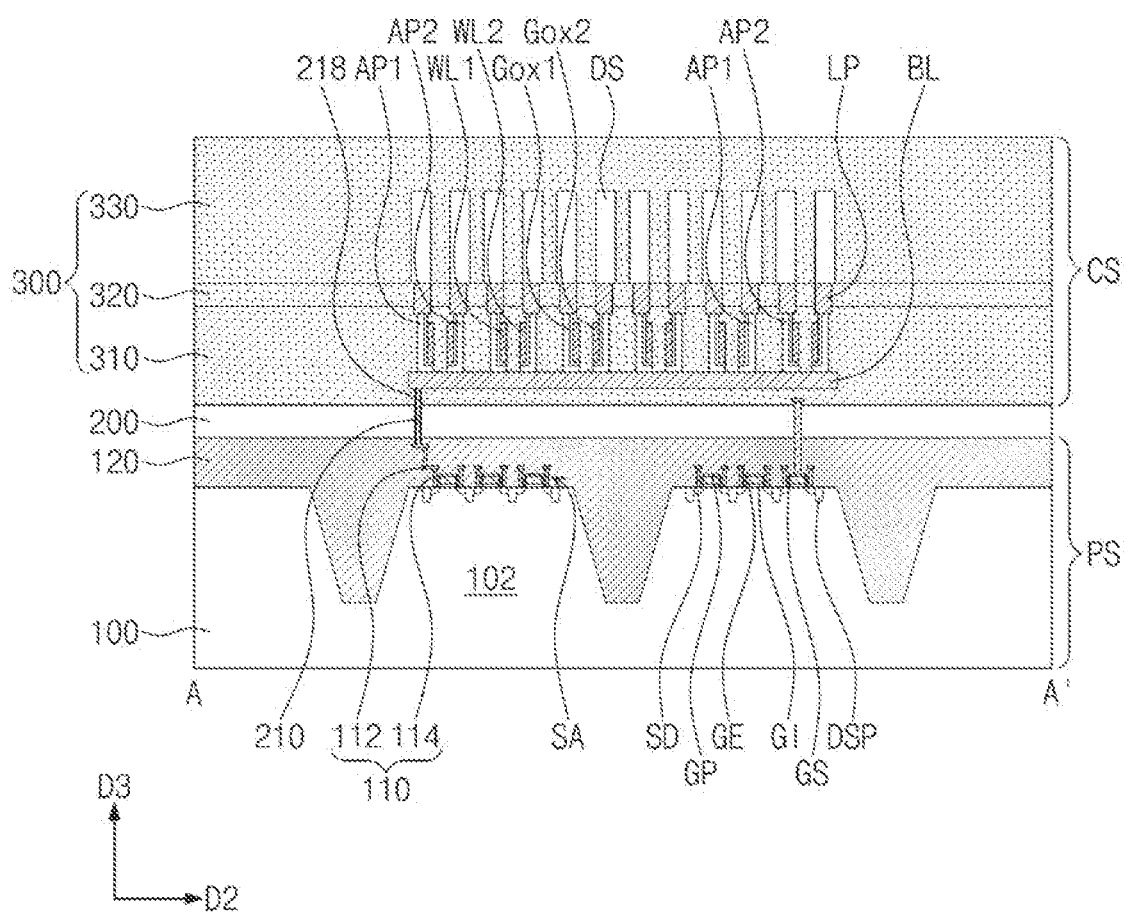

FIG. 7 illustrates a cross-sectional view showing a semiconductor memory device according to some example embodiments of the present inventive concepts.

Referring to FIG. 7, the inter-structure connection contact 210 may further include a barrier metal layer 218. The barrier metal layer 218 may surround an outer circumference of the inter-structure connection contact 210. The barrier metal layer 218 may separate the inter-structure connection contact 210 from the lower dielectric layer 120 and the upper dielectric layer 300. For example, the barrier metal layer 218 may be provided between the inter-structure connection contact 210 and the lower dielectric layer 120, between the inter-structure connection contact 210 and the upper dielectric layer 300, and between the inter-structure connection contact 210 and the shield layer 200.

The inter-structure connection contacts 210 may include metal whose resistance is low, such as copper (Cu), gold (Au), or tungsten (W). The barrier metal layer 218 may include a conductive material whose hydrogen diffusivity is low. For example, the barrier metal layer 218 may include a titanium nitride (TiN) layer or a tantalum nitride (TaN) layer.

According to some embodiments of the present inventive concepts, the barrier metal layer 218 whose hydrogen diffusivity is low may separate the inter-structure connection contact 210 from the lower dielectric layer 120 and the upper dielectric layer 300. Therefore, during fabrication or operation of the semiconductor memory device, the first and second active patterns AP1 and AP2 may be prevented from being damaged due to hydrogen atoms that diffuse from the lower dielectric layer 120 into the cell array structure CS along the inter-structure connection contacts 210. Accordingly, the semiconductor memory device may improve in structural stability and operating reliability.

Figure 8:
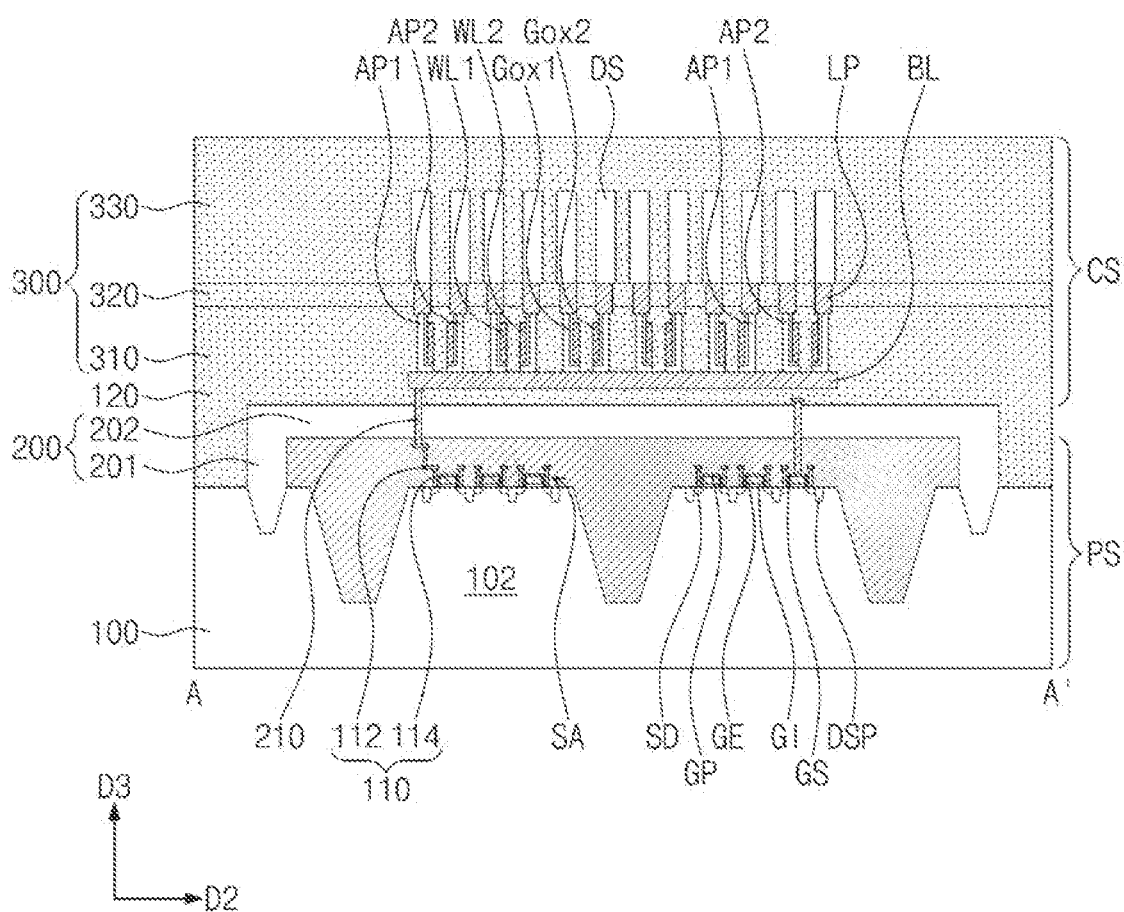

FIG. 8 illustrates a cross-sectional view showing a semiconductor memory device according to some example embodiments of the present inventive concepts.

Referring to FIG. 8, on the semiconductor substrate 100, the shield layer 200 may have a cap shape that seals the peripheral circuit structure PS. On the semiconductor substrate 100, the shield layer 200 may cover the peripheral circuit structure PS. For example, the shield layer 200 may include a first sidewall part 201 on one side of the peripheral circuit structure PS and a first upper part 202 on the peripheral circuit structure PS.

The first sidewall part 201 of the shield layer 200 may be disposed on the semiconductor substrate 100 on one side of the peripheral circuit structure PS. For example, the first sidewall part 201 may have a partition shape that extends along an outer circumference of the peripheral circuit structure PS. When viewed in a plan view, the first sidewall part 201 may surround the peripheral circuit structure PS. The first sidewall part 201 may have an annular planar shape that encloses the peripheral circuit structure PS. In example embodiments, the first sidewall part 201 may be provided on a bottom side of the first upper part 202, and may extend toward the semiconductor substrate 100. For example, a bottom surface of the first sidewall part 201 may be at a lower vertical level than a top surface of the semiconductor substrate 100.

The first upper part 202 of the shield layer 200 may be disposed above the peripheral circuit structure PS. For example, the first upper part 202 may be disposed on the first sidewall part 201 and the lower dielectric layer 120 of the peripheral circuit structure PS. For more detail, a top end of the first sidewall part 201 may be located at a level the same as or higher than that of a top surface of the lower dielectric layer 120, and the first upper part 202 may extend onto the lower dielectric layer 120 from the top end of the first sidewall part 201. The first upper part 202 may entirely cover the peripheral circuit structure PS. FIG. 8 depicts that the shield layer 200 has a tetragonal cap shape that covers the peripheral circuit structure PS, but the present inventive concepts are not limited thereto.

On the semiconductor substrate 100, the upper dielectric layer 300 may cover the shield layer 200.

According to some embodiments of the present inventive concepts, the shield layer 200 may be selectively formed on a required area, or a region on which is provided the peripheral circuit structure PS whose hydrogen concentration is high. The shield layer 200, together with the semiconductor substrate 100, may completely seal the peripheral circuit structure PS. Therefore, during fabrication or operation of the semiconductor memory device, some components in the semiconductor memory device may be prevented from being damaged due to hydrogen atoms that diffuse from the lower dielectric layer 120 into an outside of the peripheral circuit structure PS. Accordingly, the semiconductor memory device may improve in structural stability and operating reliability.

Figure 9:
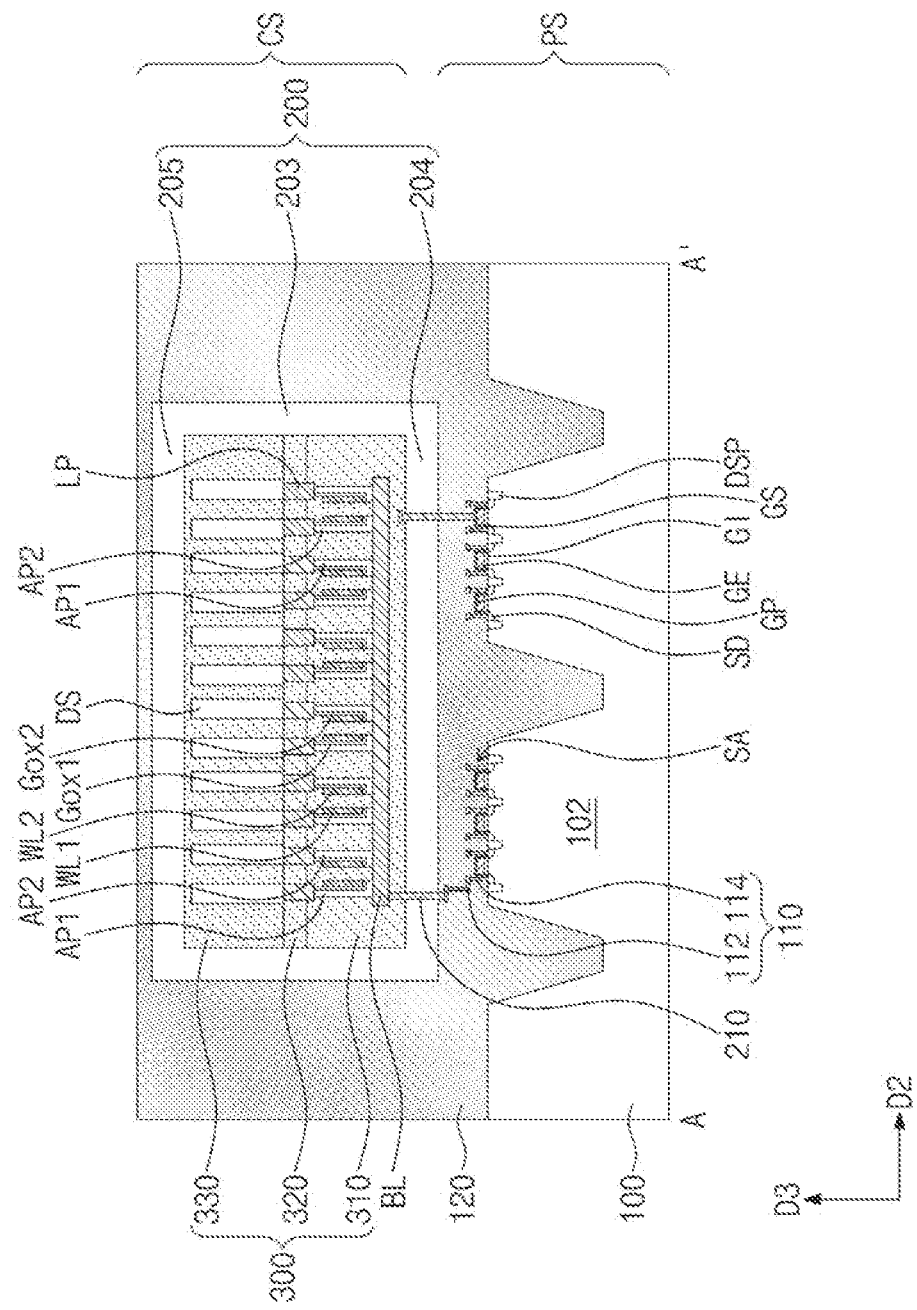

FIG. 9 illustrates a cross-sectional view showing a semiconductor memory device according to some example embodiments of the present inventive concepts.

Referring to FIG. 9, on the semiconductor substrate 100, the shield layer 200 may have a shape that seals the cell array structure CS. On the semiconductor substrate 100, the shield layer 200 may completely surround the cell array structure CS. For example, the shield layer 200 may include a second sidewall part 203 on one side of the cell array structure CS, a lower part 204 below the cell array structure CS, and a second upper part 205 on the cell array structure CS.

The second sidewall part 203 of the shield layer 200 may be disposed on the semiconductor substrate 100 on one side of the cell array structure CS. For example, the second sidewall part 203 may have a partition shape that extends along an outer circumference of the cell array structure CS. When viewed in a plan view, the second sidewall part 203 may surround the cell array structure CS. The second sidewall part 203 may have an annular planar shape that encloses the cell array structure CS.

The lower part 204 of the shield layer 200 may be disposed below the cell array structure CS. For example, the lower part 204 may support the cell array structure CS. For more detail, the lower part 204 may be provided thereon with the bit lines BL and the first dielectric pattern 310 of the cell array structure CS.

The second upper part 205 of the shield layer 200 may be disposed above the cell array structure CS. For example, the second upper part 205 may be disposed on the second sidewall part 203 and the upper dielectric layer 300 of the cell array structure CS. For more detail, a top end of the second sidewall part 203 may be located at a level the same as or higher than that of a top surface of the upper dielectric layer 300, and the second upper part 205 may extend onto the upper dielectric layer 300 from the top end of the second sidewall part 203. The second upper part 205 may entirely cover the cell array structure CS. Therefore, the shield layer 200 may surround and completely seal the cell array structure CS, in particular, the upper dielectric layer 300. In FIG. 9, the shield layer 200 is illustrated as a tetragonal box shape that surrounds the cell array structure CS, but the present inventive concepts are not limited thereto.

On the semiconductor substrate 100, the lower dielectric layer 120 may surround the shield layer 200. For example, the lower dielectric layer 120 may bury the shield layer 200 and the cell array structure CS inside the shield layer 200.

According to some embodiments of the present inventive concepts, the shield layer 200 may be selectively formed on a required area, or a region on which is provided the cell array structure CS that prevents diffusion of hydrogen. In addition, the shield layer 200 may completely seal the cell array structure CS. Therefore, during fabrication or operation of the semiconductor memory device, the cell array structure CS may be prevented from being damaged due to hydrogen atoms that diffuse from the lower dielectric layer 120 into the cell array structure CS. Accordingly, the semiconductor memory device may improve in structural stability and operating reliability.

Figure 10:
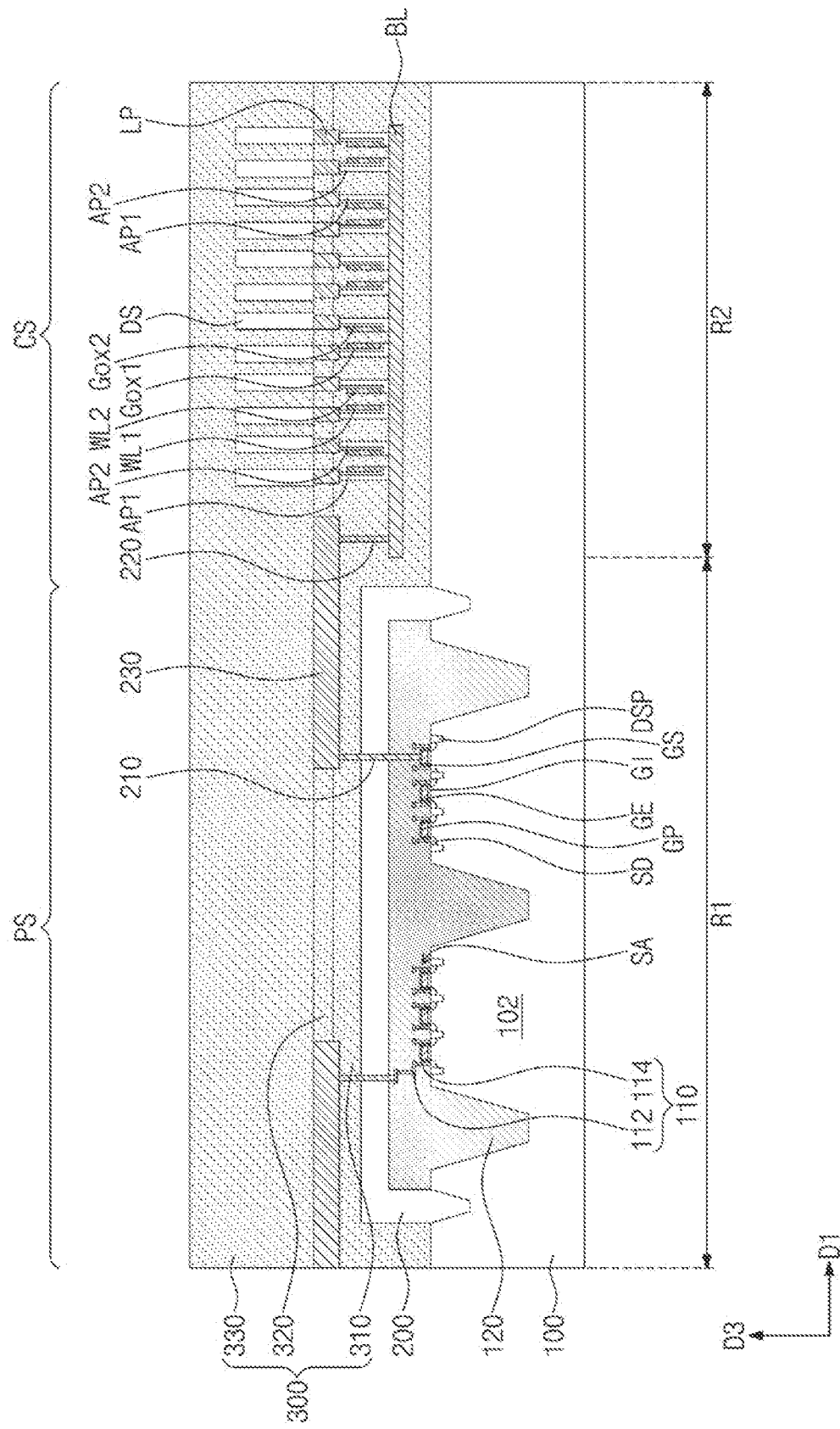

FIG. 10 illustrates a cross-sectional view showing a semiconductor memory device according to some example embodiments of the present inventive concepts.

Referring to FIG. 10, the cell array structure CS and the peripheral circuit structure PS may be disposed horizontally spaced apart from each other on the semiconductor substrate 100. For example, the cell array structure CS may be disposed on a first region R1 of the semiconductor substrate 100, and the peripheral circuit structure PS may be disposed on a second region R2 of the semiconductor substrate 100. The first region R1 and the second region R2 may be disposed adjacent to each other, and may not vertically overlap each other.

The peripheral circuit structure PS and the shield layer 200 may be the same as or similar to those discussed with reference to FIG. 8. For example, on the semiconductor substrate 100, the shield layer 200 may have a cap shape that seals the peripheral circuit structure PS. On the semiconductor substrate 100, the shield layer 200 may cover the peripheral circuit structure PS.

The cell array structure CS may be disposed on the second region R2 of the semiconductor substrate 100. For example, the second region R2 of the semiconductor substrate 100 may be provided thereon with the bit lines BL, the first and second active patterns AP1 and AP2, the first and second word lines WL1 and WL2, the first and second gate dielectric patterns Gox1 and Gox2, the landing pads LP, and the data storage patterns DS. The upper dielectric layer 300 may cover the top surface of the semiconductor substrate 100, and may bury the bit lines BL, the first and second active patterns AP1 and AP2, the first and second word lines WL1 and WL2, the first and second gate dielectric patterns Gox1 and Gox2, the landing pads LP, and the data storage patterns DS. The upper dielectric layer 300 may extend onto the first region R1 to cover the shield layer 200. In this configuration, the shield layer 200 may separate the lower dielectric layer 120 and the upper dielectric layer 300 from each other on the first region R1. Therefore, during fabrication or operation of the semiconductor memory device, the cell array structure CS may be prevented from being damaged due to hydrogen atoms that diffuse from the lower dielectric layer 120 into the cell array structure CS. Accordingly, the semiconductor memory device may improve in structural stability and operating reliability.

The cell array structure CS and the peripheral circuit structure PS may be electrically connected to each other through the inter-structure connection contacts 210, the first extension patterns 220, and the second extension patterns 230.

The inter-structure connection contacts 210 may be conductive posts (or vertical connection wiring structures such as conductive vias) which are connected to the peripheral circuit wiring pattern 110 on the first region R1 and which extend in the third direction D3 from the top surface of the peripheral circuit wiring pattern 110. The inter-structure connection contacts 210 may vertically penetrate the lower dielectric layer 120, the shield layer 200, and the first dielectric pattern 310 of the upper dielectric layer 300. The interlayer dielectric pattern 320 may cover the top surfaces of the inter-structure connection contacts 210.

The first extension patterns 220 may be conductive posts (or vertical connection wiring structures such as conductive vias) which are connected to the bit lines BL on the second region R2 and which extend in the third direction D3 from the top surfaces of the bit lines BL. The first extension patterns 220 may vertically penetrate the first dielectric pattern 310 of the upper dielectric layer 300. The interlayer dielectric pattern 320 may cover the top surfaces of the first extension patterns 220.

The second extension patterns 230 may be disposed in the interlayer dielectric pattern 320, and may be in contact with the inter-structure connection contacts 210 and the first extension patterns 220. For example, the second extension patterns 230 may correspond to horizontal wiring lines that connect the inter-structure connection contacts 210 to the first extension patterns 220. The second extension patterns 230 may be located at the same level as that of the landing pads LP.

Figure 11:
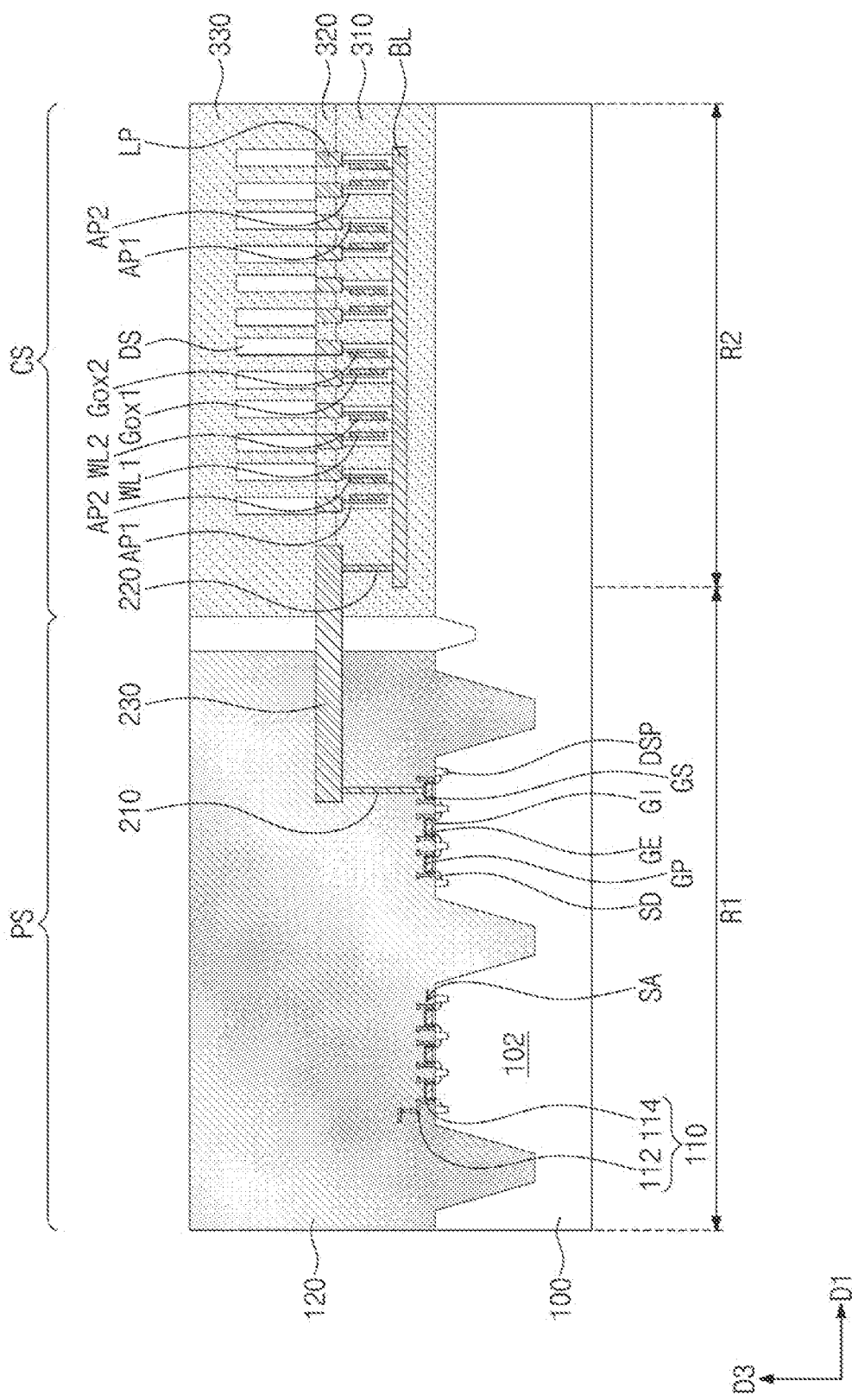

FIG. 11 illustrates a cross-sectional view showing a semiconductor memory device according to some example embodiments of the present inventive concepts.

Referring to FIG. 11, differently from that shown in FIG. 10, the shield layer 200 may have a partition shape that crosses between the first region R1 and the second region R2. The lower dielectric layer 120 may cover the core/peripheral circuits SA on the first region R1, and the upper dielectric layer 300 may cover the top surface of the semiconductor substrate 100 while burying the bit lines BL, the first and second active patterns AP1 and AP2, the first and second word lines WL1 and WL2, the first and second gate dielectric patterns Gox1 and Gox2, the landing pads LP, and the data storage patterns DS. The shield layer 200 may separate the lower dielectric layer 120 and the upper dielectric layer 300 from each other on a boundary between the first region R1 and the second region R2. Therefore, during fabrication or operation of the semiconductor memory device, the cell array structure CS may be prevented from being damaged due to hydrogen atoms that diffuse from the lower dielectric layer 120 into the cell array structure CS. Accordingly, the semiconductor memory device may improve in structural stability and operating reliability.

According to some embodiments, the shield layer 200 may be disposed not on the boundary between the first region R1 and the second region R2, but on a certain position between the cell array structure CS and the peripheral circuit structure PS.

The cell array structure CS and the peripheral circuit structure PS may be electrically connected to each other through the inter-structure connection contacts 210, the first extension patterns 220, and the second extension patterns 230.

The inter-structure connection contacts 210 may be conductive posts (or vertical connection wiring structures such as conductive vias) which are connected to the peripheral circuit wiring pattern 110 on the first region R1 and which extend in the third direction D3 from the top surface of the peripheral circuit wiring pattern 110. The inter-structure connection contacts 210 may vertically penetrate the lower dielectric layer 120.

The first extension patterns 220 may be conductive posts (or vertical connection wiring structures such as conductive vias) which are connected to the bit lines BL on the second region R2 and which extend in the third direction D3 from the top surfaces of the bit lines BL. The first extension patterns 220 may vertically penetrate the first dielectric pattern 310 of the upper dielectric layer 300. The interlayer dielectric pattern 320 may cover the top surfaces of the first extension patterns 220.

The second extension patterns 230 may be disposed in the interlayer dielectric pattern 320, and may be in contact with the inter-structure connection contacts 210 and the first extension patterns 220. For example, the second extension pattern 230 may horizontally penetrate the lower dielectric layer 120, the shield layer 200, and the upper dielectric layer 300. The second extension patterns 230 may correspond to horizontal wiring lines that connect the inter-structure connection contacts 210 to the first extension patterns 220. The second extension patterns 230 may be located at the same level as that of the landing pads LP.

FIGS. 12 to 16 illustrate cross-sectional views showing a method of fabricating a semiconductor memory device according to some example embodiments of the present inventive concepts.

Figure 12:
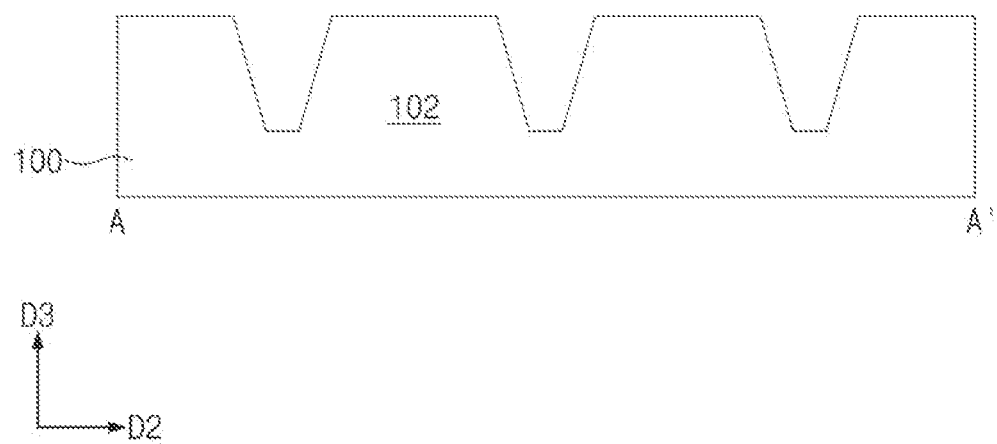
FIGS. 12 to 16 illustrate cross-sectional views showing a method of fabricating a semiconductor memory device, according to some example embodiments of the present inventive concepts.

Referring to FIG. 12, a semiconductor substrate 100 may be provided. The semiconductor substrate 100 may be patterned to form active patterns 102. The active patterns 102 may be areas on which core/peripheral circuits (see core/peripheral circuits SA of FIG. 13) will be formed. According to some embodiments, a portion of the semiconductor substrate 100 may be implanted with impurities to form a device separation layer that defines the active patterns 102. The following description will focus on the embodiment of FIG. 12.

Figure 13:
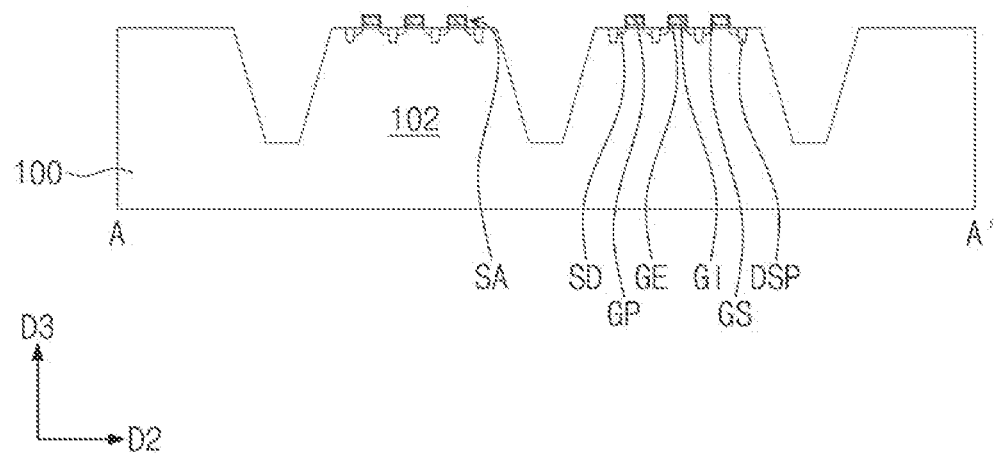

Referring to FIG. 13, core/peripheral circuits SA may be formed on the semiconductor substrate 100. For example, upper portions of the active patterns 102 may be implanted with impurities to form source/drain patterns SD. A dielectric layer, a conductive layer, and a capping layer may be formed on active patterns 102, and then may be patterned to form gate dielectric layers GI, gate electrodes GE, and gate capping patterns GP. Gate spacers GS may be formed on opposite lateral surfaces of each of the gate electrodes GE. The present inventive concepts, however, are not limited thereto, and the core/peripheral circuits SA may be formed by using various methods and may be formed to include various electronic elements such as passive elements other than transistors. In addition, device separation patterns DSP may be provided on upper portions of the active patterns 102 between the source/drain patterns SD.

Figure 14:
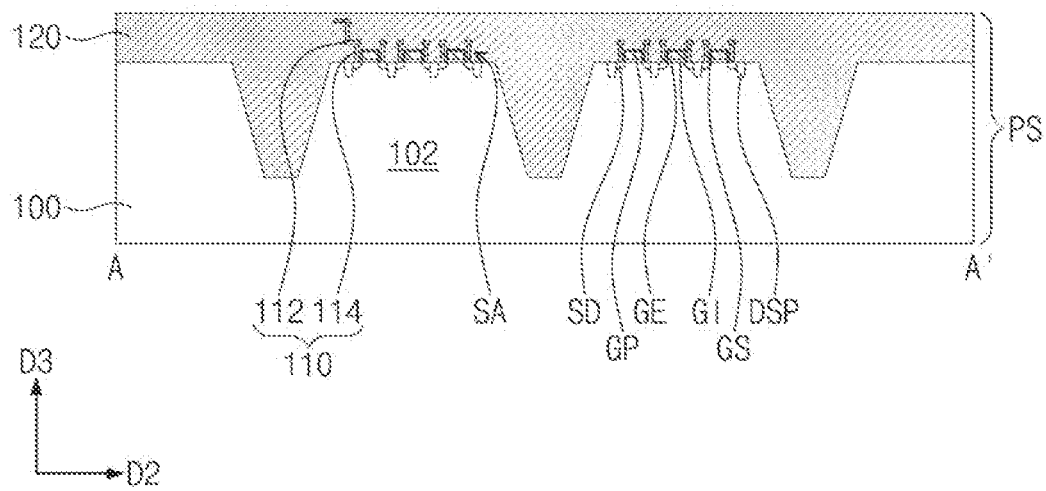

Referring to FIG. 14, there may be formed a peripheral circuit wiring pattern 110 and a lower dielectric layer 120. For example, a dielectric layer may be formed on the semiconductor substrate 100. A hole may be formed to vertically penetrate the dielectric layer, and then the hole may be filled with a conductive material to form peripheral circuit contact plugs 114 connected to the core/peripheral circuits SA. A conductive layer may be formed on the dielectric layer, and may then be patterned to form peripheral circuit wiring lines 112. Afterwards, the formation of the dielectric layer, the peripheral circuit contact plugs 114, and the peripheral circuit wiring lines 112 may be repeatedly performed to form the peripheral circuit wiring pattern 110 and the lower dielectric layer 120.

According to some embodiments, an annealing process may further be performed on the lower dielectric layer 120. The annealing process may be executed to implant hydrogen atoms into the lower dielectric layer 120. After the annealing process, the lower dielectric layer 120 may have an increased hydrogen concentration. Alternatively, other process may be performed to implant hydrogen atoms into the lower dielectric layer 120. The increase in hydrogen concentration of the lower dielectric layer may prevent interface defects from occurring in transistors of the core/peripheral circuits SA formed based on silicon (Si). In some embodiments, the annealing process may not be provided.

Figure 15:
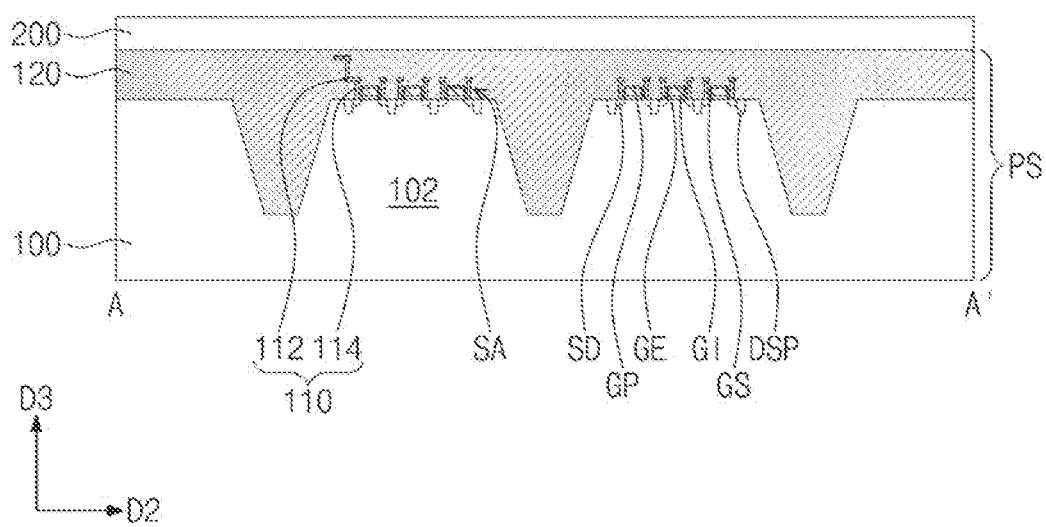

Referring to FIG. 15, a shield layer 200 may be formed on the lower dielectric layer 120. For example, a material whose hydrogen diffusivity is less than that of a material included in the lower dielectric layer may be deposited on the lower dielectric layer 120, thereby forming the shield layer 200. The material may include, for example, aluminum oxide ($Al_2O_3$) or metal nitride. The metal nitride may include titanium nitride (TiN) or tantalum nitride (TaN). When the lower dielectric layer 120 includes silicon oxide ($SiO_2$), the material may be silicon nitride ($Si_3N_4$) whose hydrogen diffusivity is less than that of silicon oxide ($SiO_2$).

Figure 16:
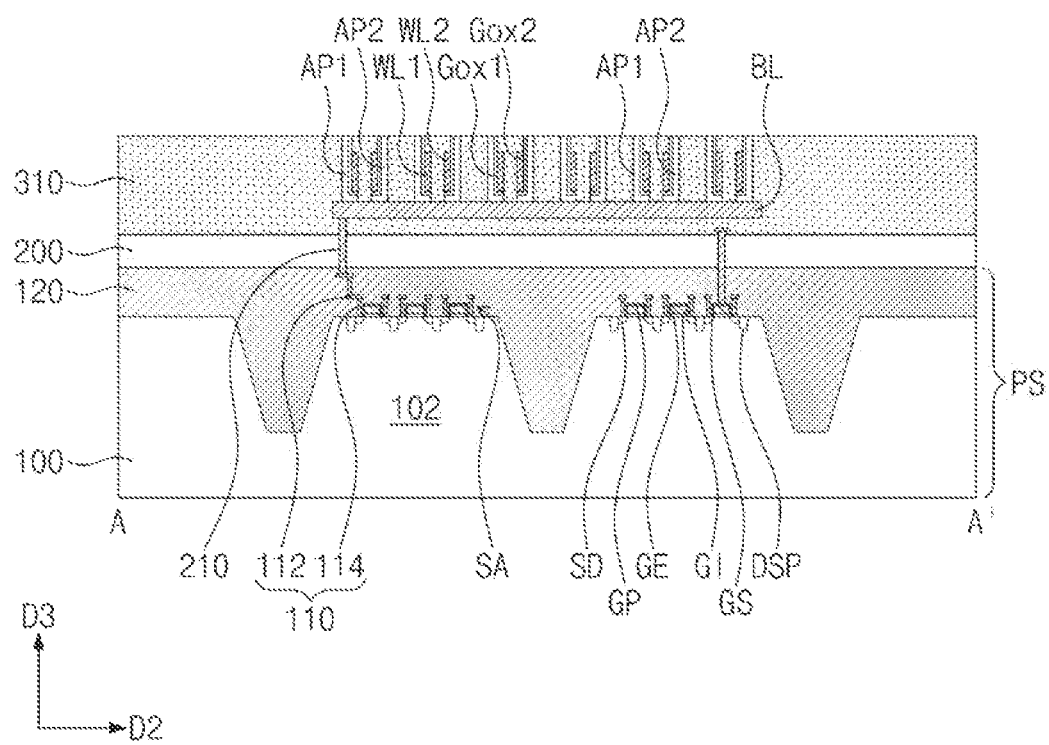

Referring to FIG. 16, a cell array structure CS may be formed on the shield layer 200. The following will describe an example of forming the cell array structure CS.

A first dielectric layer may be formed on the shield layer 200. A hole may be formed to vertically penetrate the first dielectric layer and the shield layer 200, and then the hole may be filled with a conductive material to form an inter-structure connection contact 210.

A conductive layer may be deposited on the first dielectric layer, and then the conductive layer may be patterned to form bit lines BL. A gap-fill dielectric pattern may fill a space between the bit lines BL. Alternatively, trenches may be formed in the gap-fill dielectric pattern, and then the trenches may be filled with a conductive material to form the bit lines BL.

On the first dielectric layer, a mold dielectric pattern may be formed which has trenches that extend in a second direction D2 and are spaced apart from each other in a first direction D1. The trenches may expose portions of the bit lines BL.

An active layer, a gate dielectric layer, and a conductive layer may be formed to conformally cover the mold dielectric pattern, and then may be patterned to form first and second active patterns AP1 and AP2, first and second gate dielectric patterns Gox1 and Gox2, and first and second word lines WL1 and WL2.

A second dielectric layer may be formed on the first dielectric layer. A dielectric layer may be deposited to completely fill the trenches in which the first and second word lines WL1 and WL2 are formed, and then a planarization process may be performed to expose top surfaces of the first and second active patterns AP1 and AP2, with the result that the second dielectric layer may be formed. The first dielectric layer, the gap-fill dielectric pattern, and the second dielectric layer may constitute a first dielectric pattern 310 discussed with reference to FIGS. 3 and 4.

A high-temperature annealing process may be added when forming each of the first dielectric pattern 310, the first and second active patterns AP1 and AP2, the first and second gate dielectric patterns Gox1 and Gox2, and the first and second word lines WL1 and WL2.

According to some embodiments of the present inventive concepts, the first dielectric pattern 310, the first and second active patterns AP1 and AP2, the first and second gate dielectric patterns Gox1 and Gox2, and the first and second word lines WL1 and WL2 may be separated through the shield layer 200 from the lower dielectric layer 120. Therefore, during the processes mentioned above, the cell array structure CS may be prevented from being damaged due to hydrogen atoms that diffuse from the lower dielectric layer 120 into the cell array structure CS. Accordingly, there may be provided a semiconductor memory device having improved structural stability and increased operating reliability.

Referring back to FIG. 4, an interlayer dielectric pattern 320 may be formed on the first dielectric pattern 310. Holes that expose the first and second active patterns AP1 and AP2 may be formed in the interlayer dielectric pattern 320, and then the holes may be filled with a conductive material to form landing pads LP. Data storage patterns DS may be formed on the interlayer dielectric pattern 320, thereby being coupled to the landing pads LP. A second dielectric pattern 330 may be formed on the interlayer dielectric pattern 320, covering the data storage patterns DS.

In a semiconductor memory device according to some embodiments of the present inventive concepts, as a lower dielectric layer of a peripheral circuit structure has a large amount of hydrogen, the lower dielectric layer may prevent interface defects from occurring in transistors of core/peripheral circuits formed based on silicon (Si). As an upper dielectric layer of a cell array structure contains no or small amount of hydrogen, first and second active patterns formed based on IGZO may be prevented from being damaged due to hydrogen atoms. In addition a shield layer may include a material whose hydrogen diffusivity is low. Therefore, during fabrication or operation of the semiconductor memory device, the first and second active patterns may be prevented from being damaged due to hydrogen atoms that diffuse from the lower dielectric layer into the cell array structure. Accordingly, the semiconductor memory device may improve in structural stability and operating reliability.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor memory device, comprising:
a peripheral circuit structure including peripheral circuits on a semiconductor substrate and a first dielectric layer that covers the peripheral circuits;
a cell array structure on the semiconductor substrate; and
a shield layer between the peripheral circuit structure and the cell array structure,
wherein the cell array structure includes:
bit lines that extend lengthwise in a first direction on the semiconductor substrate;
first and second active patterns that are alternately disposed along the first direction on each of the bit lines, each of the first and second active patterns including a horizontal part and a vertical part, the first and second active patterns that are adjacent to each other being disposed symmetrically to each other;
first word lines that extend lengthwise in a second direction, cross the bit lines, and are disposed on the horizontal parts of the first active patterns;
second word lines that extend lengthwise in the second direction, cross the bit lines, and are disposed on the horizontal parts of the second active patterns;
data storage patterns on the first and second active patterns; and
a second dielectric layer on the semiconductor substrate, the second dielectric layer covering the bit lines, the first and second active patterns, the first and second word lines, and the data storage patterns, and
wherein a hydrogen concentration of the first dielectric layer is greater than a hydrogen concentration of the second dielectric layer.

2. The device of claim 1, wherein the cell array structure is disposed on the peripheral circuit structure.

3. The device of claim 2,
wherein the shield layer has a cap shape that seals the peripheral circuit structure on the semiconductor substrate,
wherein on the semiconductor substrate, the shield layer surrounds the peripheral circuit structure when viewed in a plan view and downwardly covers the peripheral circuit structure, and
wherein the second dielectric layer covers the shield layer on the semiconductor substrate.

4. The device of claim 2, further comprising:
inter-structure connection contacts that connect the peripheral circuits of the peripheral circuit structure to the bit lines of the cell array structure,
wherein the inter-structure connection contacts vertically penetrate the first dielectric layer, the second dielectric layer, and the shield layer.

5. The device of claim 4, further comprising extension patterns disposed on the bit lines and electrically connecting the bit lines to the inter-structure connection contacts.

6. The device of claim 4,
wherein the inter-structure connection contacts include a barrier metal part adjacent to the shield layer, and
wherein a hydrogen diffusivity of the barrier metal part is less than a hydrogen diffusivity of the first dielectric layer.

7. The device of claim 2,
wherein the first dielectric layer covers the semiconductor substrate,
wherein the second dielectric layer covers the first dielectric layer, and
wherein the shield layer has a plate shape between the first dielectric layer and the second dielectric layer.

8. The device of claim 2,
wherein the shield layer has a box shape that seals the cell array structure on the semiconductor substrate,
wherein on the peripheral circuit structure, the shield layer surrounds the cell array structure when viewed in a plan view, upwardly supports the cell array structure, and downwardly covers the cell array structure, and
wherein the first dielectric layer buries the shield layer on the semiconductor substrate.

9. The device of claim 1, wherein the shield layer includes aluminum oxide ($Al_2O_3$) or metal nitride.

10. The device of claim 1, wherein the cell array structure includes:
first gate dielectric patterns between the first active patterns and first sidewalls of the first word lines and between the first active patterns and bottom surfaces of the first word lines; and
second gate dielectric patterns between the second active patterns and second sidewalls of the second word lines and between the second active patterns and bottom surfaces of the second word lines.

11. The device of claim 1, wherein the cell array structure further includes landing pads on the vertical parts of the first and second active patterns, the landing pads connecting the first and second active patterns to the data storage patterns.

12. The device of claim 1,
wherein the cell array structure is horizontally spaced apart from the peripheral circuit structure on the semiconductor substrate, and
wherein the shield layer has a partition shape between the cell array structure and the peripheral circuit structure on the semiconductor substrate.

13. The device of claim 12,
wherein the shield layer has a cap shape that seals the peripheral circuit structure on the semiconductor substrate, and
wherein the second dielectric layer covers the shield layer on the semiconductor substrate.

14. A semiconductor memory device, comprising:
a first circuit structure and a second circuit structure that are spaced apart from each other on a semiconductor substrate;
a shield layer that separates the first and second circuit structures from each other; and
a connection contact that penetrates the shield layer and connects the first and second circuit structures to each other,
wherein the first circuit structure includes a first transistor and a first dielectric layer that covers the first transistor,
wherein the second circuit structure includes a second transistor and a second dielectric layer that covers the second transistor,
wherein the second transistor includes:
 a bit line that extends lengthwise in a first direction on the semiconductor substrate;
 first and second active patterns that are disposed along the first direction on the bit line;
 first word lines that extend lengthwise in a second direction, cross the bit line, and are disposed on the first active patterns; and
 second word lines that extend lengthwise in the second direction, cross the bit line, and are disposed on the second active patterns, and wherein a hydrogen diffusivity of the shield layer is less than a hydrogen diffusivity of the first dielectric layer and a hydrogen diffusivity of the second dielectric layer.

15. The device of claim 14,
wherein the second circuit structure is disposed on the first circuit structure,
wherein the shield layer has a cap shape that seals the first circuit structure on the semiconductor substrate,
wherein on the semiconductor substrate, the shield layer surrounds the first circuit structure when viewed in a plan view and downwardly covers the first circuit structure, and
wherein the second dielectric layer covers the shield layer on the semiconductor substrate.

16. The device of claim 14,
wherein the first circuit structure and the second circuit structure are horizontally spaced apart from each other on the semiconductor substrate, and
wherein the shield layer has a partition shape that crosses between the first circuit structure and the second circuit structure on the semiconductor substrate.

17. The device of claim 14,
wherein the second circuit structure is disposed on the first circuit structure,
wherein the shield layer has a box shape that seals the second circuit structure on the semiconductor substrate,
wherein on the first circuit structure, the shield layer surrounds the second circuit structure when viewed in a plan view, upwardly supports the second circuit structure, and downwardly covers the second circuit structure, and
wherein the first dielectric layer buries the shield layer on the semiconductor substrate.

* * * * *